(12) United States Patent
Kobayashi

(10) Patent No.: US 9,184,726 B2
(45) Date of Patent: Nov. 10, 2015

(54) PIEZOELECTRIC VIBRATING STRIP, PIEZOELECTRIC VIBRATOR, OSCILLATOR, ELECTRONIC DEVICE, AND RADIO TIMEPIECE

(71) Applicant: SII Crystal Technology Inc., Chiba (JP)

(72) Inventor: Takashi Kobayashi, Chiba (JP)

(73) Assignee: SII CRYSTAL TECHNOLOGY INC., Chiba (JP)

( * ) Notice: Subject to any disclaimer, the term of this patent is extended or adjusted under 35 U.S.C. 154(b) by 143 days.

(21) Appl. No.: 14/055,331

(22) Filed: Oct. 16, 2013

(65) Prior Publication Data

US 2014/0111065 A1    Apr. 24, 2014

(30) Foreign Application Priority Data

Oct. 19, 2012   (JP) ................................. 2012-231873

(51) Int. Cl.
| | |
|---|---|
| *H03H 9/21* | (2006.01) |
| *H03H 9/02* | (2006.01) |
| *H03H 9/10* | (2006.01) |

(52) U.S. Cl.
CPC .............. *H03H 9/21* (2013.01); *H03H 9/02157* (2013.01); *H03H 9/1021* (2013.01)

(58) Field of Classification Search
USPC ........................................................ 310/370
See application file for complete search history.

(56) References Cited

U.S. PATENT DOCUMENTS

| 7,067,966 | B2 * | 6/2006 | Tanaya .......................... 310/367 |
| 7,112,915 | B2 * | 9/2006 | Tanaya et al. ................. 310/370 |
| 7,863,803 | B2 * | 1/2011 | Yamada et al. ............... 310/370 |
| 7,986,077 | B2 * | 7/2011 | Yamamoto .................... 310/370 |
| 8,102,103 | B2 * | 1/2012 | Furuhata et al. .............. 310/370 |
| 8,299,863 | B2 * | 10/2012 | Tanaya et al. ................. 331/156 |
| 2012/0039153 | A1 * | 2/2012 | Kobayashi .................... 368/159 |
| 2012/0195170 | A1 * | 8/2012 | Kobayashi ...................... 368/47 |
| 2013/0076210 | A1 * | 3/2013 | Minegishi ..................... 310/370 |
| 2013/0076211 | A1 * | 3/2013 | Arimatsu ...................... 310/370 |
| 2014/0078870 | A1 * | 3/2014 | Kobayashi ...................... 368/47 |

FOREIGN PATENT DOCUMENTS

JP    2009-081520 A    4/2009

* cited by examiner

*Primary Examiner* — J. San Martin
(74) *Attorney, Agent, or Firm* — Brinks Gilson & Lione

(57) ABSTRACT

A piezoelectric vibrating strip includes a pair of vibrating arm portions in parallel with a central axis therebetween, and a base portion integrally cantilevering base end portions of the pair of vibrating arm portions in a length direction. Each of the pair of vibrating arm portions has a first groove portion and a second groove portion in a main face, the first groove portion being placed closer to a leading end portion in the length direction of the vibrating arm portions and having a groove width along a width direction orthogonal to the length direction and a thickness direction of the vibrating arm portion. The second groove portion is closer to the base end portion than the first groove portion and has a groove width along the width direction. The groove width ratio of the second groove portion to the first groove portion is between 0.4 and 1.0.

13 Claims, 16 Drawing Sheets

PIEZOELECTRIC VIBRATING STRIP, PIEZOELECTRIC VIBRATOR, OSCILLATOR, ELECTRONIC DEVICE, AND RADIO TIMEPIECE

RELATED APPLICATIONS

This application claims priority under 35 U.S.C. §119 to Japanese Patent Application No. 2012-231873 filed on Oct. 19, 2012, the entire content of which is hereby incorporated by reference.

FIELD OF THE INVENTION

The present invention relates to a piezoelectric vibrating strip, a piezoelectric vibrator, an oscillator, an electronic device, and a radio timepiece.

BACKGROUND ART

A cellular phone and a portable information terminal device have a piezoelectric vibrator using a crystal or the like as a time source, a timing source for a control signal, a reference signal source and the like. Various piezoelectric vibrators of this type have been provided, and among them, a known piezoelectric vibrator includes a piezoelectric vibrating strip of a tuning fork type.

The piezoelectric vibrating strip of the tuning fork type includes a pair of vibrating arm portions extending in parallel and a base portion supporting the base end portions of the pair of vibrating arm portions. An electrode film is formed on the outer face of the piezoelectric vibrating strip. When a voltage is applied to the electrode film, the pair of vibrating arm portions can vibrate at a predetermined resonance frequency in the direction in which they are brought closer to or away from each other.

In recent years, as the device having the piezoelectric vibrator mounted thereon is reduced in size, a reduced size is desired in the piezoelectric vibrating strip.

For example when the width of the vibrating arm portion is reduced, however, the width of the electrode film (exciting electrode) formed on the vibrating arm portion is also reduced to increase the crystal impedance (CI) value, thereby degrading the quality of an output signal.

The resonance frequency F at which the pair of vibrating arm portions vibrate is represented by $F=k(W/L^2)$ (where k represents the coefficient, W represents the width of the vibrating arm portion, and L represents the length of the vibrating arm portion).

When the length or the width of the vibrating arm portion is changed, the resonance frequency F is shifted to change the vibration characteristics. The attempt to reduce the size of the piezoelectric vibrating strip needs to be made carefully so as to avoid the shift of the resonance frequency.

To address this, a known approach to reducing the width of the vibrating arm portion is to form a groove portion in each of the upper and lower faces of the vibrating arm portion (see, for example, JP-A-2009-81520).

Since the formation of the groove portion provides the arrangement of a pair of exciting electrodes opposite to each other on the sides of the groove portion, the electric field can efficiently act in the opposite directions. This can increase the electric field efficiency even when the width of the vibrating arm portion is reduced, so that the size reduction can be achieved with the resonance frequency maintained.

As described above, the formation of the groove portion in the vibrating arm portion is effective in increasing the electric field efficiency to reduce the CI value. Particularly, as the size of the groove portion is increased relative to the vibrating arm portion, the CI value can be effectively reduced.

On the other hand, the rigidity of the vibrating arm portion is reduced by forming the groove portion. Particularly, when the width of the groove portion is increased, the rigidity of the vibrating arm portion is reduced accordingly. For example, if an external shock or the like is given to the piezoelectric vibrating strip, the vibrating arm portion may be deformed or broken. When the groove portion is formed near the portion connecting the base end portions of the vibrating arm portions to the base portion, the CI value is effectively reduced but the vibrating arm portion is easily deformed or broken.

SUMMARY OF THE INVENTION

The present invention has been made in view of such situations, and it is an object thereof to provide a piezoelectric vibrating strip capable of reducing the CI value while suppressing the reduction in rigidity of the vibrating arm portion, allowing the reduction in size, and achieving excellent vibrating characteristics and high resistance to shock.

It is another object of the present invention to provide a piezoelectric vibrator including the piezoelectric vibrating strip, and an oscillator, and an electronic device, and a radio timepiece including the piezoelectric vibrator.

The present invention provides the following means in order to solve the problems described above.

(1) According to the present invention, a piezoelectric vibrating strip includes a pair of vibrating arm portions placed in parallel with a central axis interposed between them, and a base portion integrally cantilevering base end portions of the pair of vibrating arm portions in a length direction, wherein each of the pair of vibrating arm portions has a first groove portion and a second groove portion formed in a main face, the first groove portion being placed closer to a leading end portion in the length direction of the vibrating arm portion and having a groove width W1 along a width direction orthogonal to the length direction and a thickness direction of the vibrating arm portion, the second groove portion being placed closer to the base end portion than the first groove portion and having a groove width W2 along the width direction, and the ratio of the groove width W2 of the second groove portion/the groove width W1 of the first groove portion is set to be equal to or higher than 0.4 and to be lower than 1.0.

With the piezoelectric vibrating strip according to the present invention, each of the pair of vibrating arm portions has the first groove portion and the second groove portion formed therein, so that exciting electrodes formed on the outer face of the vibrating arm portion can be opposed to each other on the sides of each groove portion to increase the electric field efficiency to reduce the CI value. Consequently, a reduced size can be achieved such as a reduction in width of the vibrating arm portion while maintaining the vibration characteristics.

Particularly, the groove width W2 of the second groove portion located closer to the base end portion of the vibrating arm portion is formed to be smaller than the groove width W1 of the first groove portion, and the groove width ratio of the groove width W2 of the second groove portion/the groove width W1 of the first groove portion is set to be equal to or higher than 0.4 and to be lower than 1.0. This can suppress a reduction in rigidity at the base end portion of the vibrating arm portion where stress is easily concentrated, which can suppress a reduction in rigidity of the overall vibrating arm portion.

As a result, the CI value can be reduced while suppressing the reduced rigidity of the vibrating arm portion, thereby providing the piezoelectric vibrating strip which can be reduced in size with excellent vibration characteristics and high resistance to shock. Particularly, since the reduced rigidity is suppressed at the base end portion of the vibrating arm portion, vibration leaks or the like can be suppressed.

If the ratio of the groove width W2 of the second groove portion/the groove width W1 of the first groove portion is lower than 0.4, the precise formation of the second groove portion is difficult, and the electric field efficiency in the second groove portion may be reduced to increase the CI value.

(2) In the piezoelectric vibrating strip according to the present invention, the following relationship is preferably satisfied:

the ratio of a groove length L2 of the second groove portion/a length L0 is equal to or higher than 0.04 and is equal to or lower than 0.3, where the length L0 represents the groove length along the length direction from the portion of the second groove portion located closer to the base end portion to the portion of the first groove portion located closer to the leading end portion and the groove length L2 represents the groove length of the second groove portion along the length direction.

Since the ratio of the groove length L2 of the second groove portion/the length L0 is set to be equal to or higher than 0.04 and equal to or lower than 0.3, the first groove portion with the groove width larger than that of the second groove portion can have the larger groove length. Thus, the first groove portion with the larger groove width can contribute more to reducing the CI value to accomplish the reduction in the CI value reliably.

If the ratio of the groove length L2 of the second groove portion/the length L0 is lower than 0.04, the second groove portion is too short to contribute to reducing the CI value, and the CI value may be increased. On the other hand, if the ratio of the groove length L2 of the second groove portion/the length L0 is higher than 0.3, the first groove portion with the large width effectively contributing to reducing the CI value is reduced in length, so that the CI value may also be increased.

(3) In the piezoelectric vibrating strip according to the present invention, the second groove portions are preferably placed in line symmetry with respect to the central axis.

In this case, since the second groove portions are formed on the pair of vibrating arm portions so as to locate in line symmetry with respect to the central axis (that is, the central axis in the width direction of the piezoelectric vibrating strip) disposed between the pair of vibrating arm portions, the pair of vibrating arm portions can be vibrated uniformly in the direction in which they are brought closer to or away from each other. This can prevent an increase in the CI value, vibration leaks and the like, to improve the vibration characteristics.

(4) In the piezoelectric vibrating strip according to the present invention, the second groove portions are preferably placed in line symmetry with respect to a virtual central axis dividing an etching residue left on a crotch located at the base end portions of the pair of vibrating arm portions into two in the width direction and extending in the length direction.

In this case, since the second groove portions are placed on the pair of vibrating arm portions in line symmetry with respect to the virtual central axis in view of the etching residue, the vibrating arm portions can be vibrated uniformly in the direction in which they are brought closer to or away from each other, and the vibrating arm portions can be effectively prevented from breaking near the base end portions.

Specifically, the etching residue is created at the crotch of the vibrating arm portions due to the etching anisotropy in etching processing. In addition, the production of the etching residue is localized to a portion closer to one of the vibrating arm portions. When an external shock or the like is given, the vibrating arm portion closer to the etching residue is subjected to cracks and the like originating from the etching residue.

The formation of the second groove portions in line symmetry with respect to the virtual central axis can prevent the formation of the second groove portion near the etching residue to suppress the creation of the cracks. As described above, the pair of vibrating arm portions can be vibrated uniformly in the direction in which they are brought closer to or away from each other, and the vibrating arm portions can be effectively prevented from breaking near the base end portions.

(5) A piezoelectric vibrator according to the present invention includes the piezoelectric vibrating strip according to the present invention, and a package including a base substrate and a lid substrate bonded together, the piezoelectric vibrating strip being housed in a cavity formed between the base substrate and the lid substrate.

With the piezoelectric vibrator according to the present invention, since the piezoelectric vibrating strip which can be reduced in size with excellent vibration characteristics and high resistance to shock is included, the resulting piezoelectric vibrator can have high quality and be reduced in size with improved reliability and durability in operation.

(6) An oscillator according to the present invention includes the piezoelectric vibrator according to the present invention electrically connected as an oscillator to an integrated circuit.

(7) An electronic device according to the present invention includes the piezoelectric vibrator according to the present invention electrically connected to a time measuring section.

(8) A radio timepiece according to the present invention includes the piezoelectric vibrator according to the present invention electrically connected to a filter section.

With the oscillator, the electronic device, and the radio timepiece according to the present invention, the piezoelectric vibrating strip described above is included, so that the size reduction can be accomplished while improving reliability and durability in operation in the same manner According to the present invention, the piezoelectric vibrating strip can be provided which can reduce the CI value while suppressing the reduction in rigidity of the vibrating arm portion, allows the reduction in size, and achieves excellent vibration characteristics and high resistance to shock.

BRIEF DESCRIPTION OF THE DRAWINGS

FIGS. 18A to 18C show graphs illustrating analysis results from an example of the piezoelectric vibrating strip according to the present invention, in which FIG. 18A is a graph showing the relationship between the ratio of the groove width W2 of the second groove portion/the groove width W1 of the first groove portion and the frequency change, FIG. 18B is a graph showing the relationship between the ratio of the groove width W2 of the* second groove portion/the groove width W1 of the first groove portion and the CI value change, and FIG. 18C is a graph showing the relationship between the ratio of the groove width W2 of the second groove portion/the groove width W1 of the first groove portion and the CI value.

FIGS. 19A to 19C show graphs illustrating other analysis results from the example of the piezoelectric vibrating strip according to the present invention, in which FIG. 19A is a graph showing the relationship between the ratio of the groove width W2 of the second groove portion/the groove width W1 of the first groove portion and the frequency change, FIG. 19B is a graph showing the relationship between the ratio of the groove width W2 of the second groove portion/the groove width W1 of the first groove portion and the CI value change, and FIG. 19C is a graph showing the relationship between the ratio of the groove width W2 of the second groove portion/the groove width W1 of the first groove portion and the CI value.

FIGS. 20A to 20C show graphs illustrating other analysis results from the example of the piezoelectric vibrating strip according to the present invention, in which FIG. 20A is a graph showing the relationship between the ratio of the groove width W2 of the second groove portion/the groove width W1 of the first groove portion and the frequency change, FIG. 20B is a graph showing the relationship between the ratio of the groove width W2 of the second groove portion/ the groove width W1 of the first groove portion and the CI value change, and FIG. 20C is a graph showing the relationship between the ratio of the groove width W2 of the second groove portion/the groove width W1 of the first groove portion and the CI value.

FIGS. 21A to 21C show diagrams in the example of the piezoelectric vibrating strip according to the present invention, in which FIG. 21A is a diagram showing the second groove portion formed at the center of the vibrating arm portion in the width direction, FIG. 21B is a diagram showing the second groove portion formed at the position offset outward from the center of the vibrating arm portion in the width direction, and FIG. 21C is a diagram showing the second groove portion formed at the position offset inward from the center of the vibrating arm portion in the width direction.

FIGS. 22A to 22C show graphs illustrating analysis results from the piezoelectric vibrating strips shown in FIGS. 21A to 21C, in which FIG. 22A is a graph showing the relationship between the offset amount and the CI value, FIG. 22B is a graph showing the relationship between the offset amount and the frequency changes, and FIG. 22C is a graph showing the relationship between the offset amount and the CI value change.

DETAILED DESCRIPTION OF THE INVENTION

Figure 1:
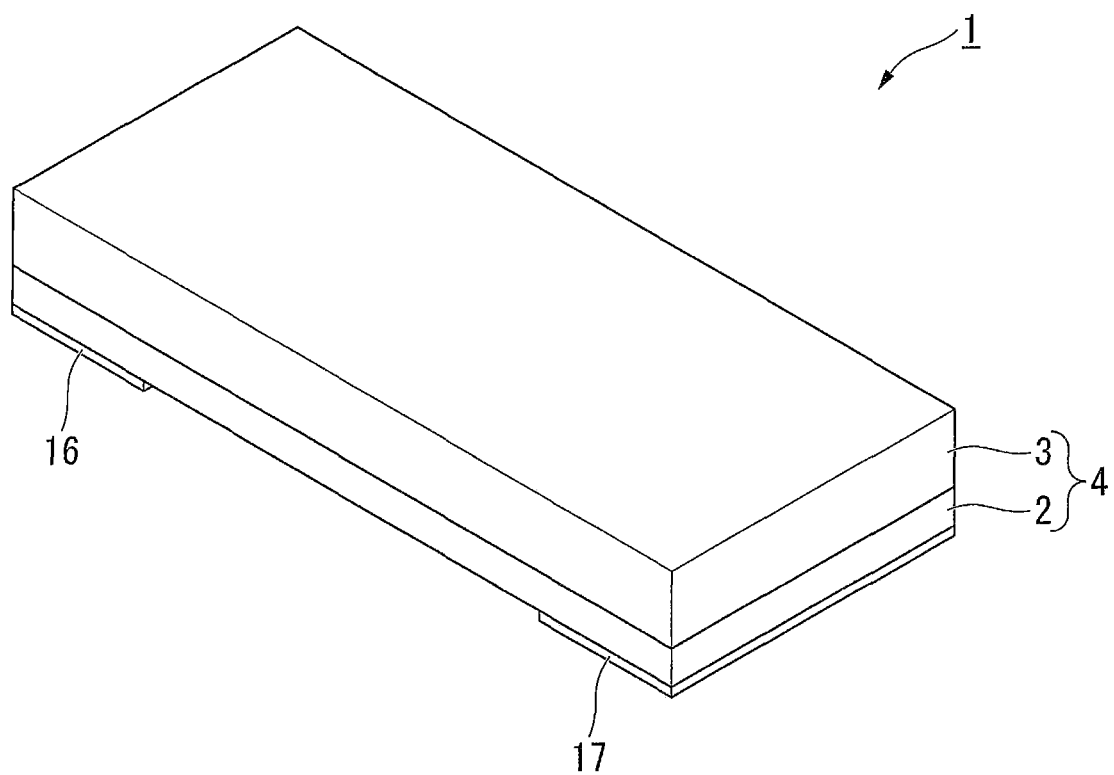
FIG. 1 is an external perspective view showing an embodiment of a piezoelectric vibrator according to the present invention.
Figure 2:
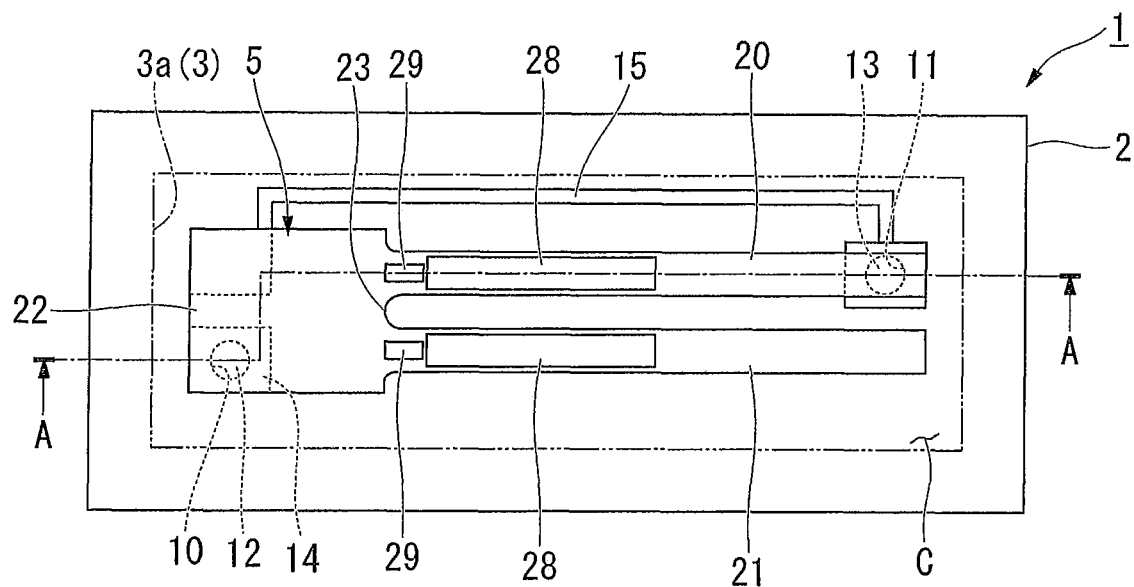
FIG. 2 is a diagram of the internal structure of the piezoelectric vibrator shown in FIG. 1 and shows a piezoelectric vibrating strip viewed from above with a lid substrate removed therefrom.
Figure 3:
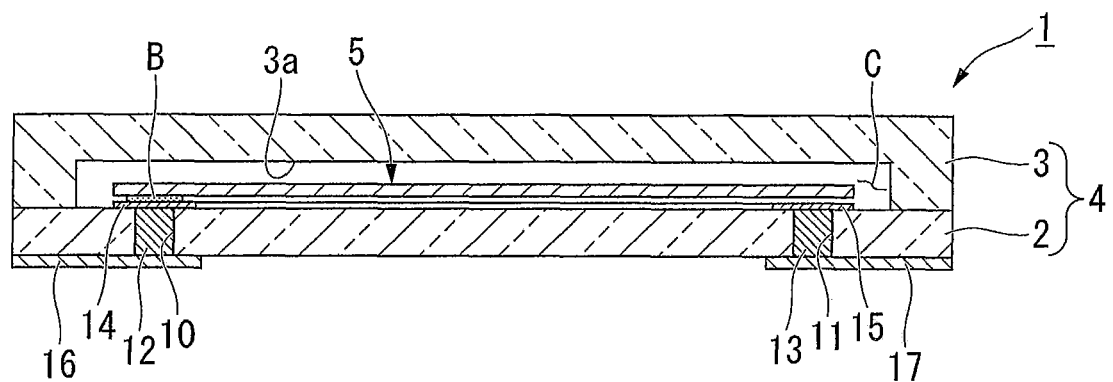
FIG. 3 is a section view of the piezoelectric vibrator taken along a line A-A in FIG. 2.

Description will hereinafter be made of embodiments of a piezoelectric vibrating strip and a piezoelectric vibrator according to the present invention with reference to the drawings.

(Configuration of Piezoelectric Vibrator)

As shown in FIG. 1 to FIG. 4, a piezoelectric vibrator 1 according to the present embodiment is of a surface-mounting type including a package 4 provided, for example by anode-bonding a base substrate 2 to a lid substrate 3 or by bonding them with a bonding film, not shown, interposed between them, and a piezoelectric vibrating strip 5 housed in a cavity C formed within the package 4.

Each of the base substrate 2 and the lid substrate 3 is a transparent insulating substrate made of a glass material, for example soda-lime glass formed in a generally plate shape. The lid substrate 3 has a rectangular recess portion 3a formed in its bonding face to which the base substrate 2 is bonded such that the piezoelectric vibrating strip 5 is fitted therein. When the lid substrate 3 is overlaid over the base substrate 2, the recess portion 3a serves as the cavity C for housing the piezoelectric vibrating strip 5.

The base substrate 2 has a pair of through holes 10 and 11 passing therethrough in the thickness direction of the base substrate 2. The through holes 10 and 11 are formed at the positions falling within the cavity C. More specifically, the through holes 10 and 11 in the present embodiment are configured such that one through hole 10 is formed at the position of a base portion 22 of the mounted piezoelectric vibrating strip 5 and the other through hole 11 is formed at the position of the leading end portions of vibrating arm portions 20 and 21.

A pair of through electrodes 12 and 13 are formed in the pair of through holes 10 and 11, respectively, to fill the through holes 10 and 11. The through electrodes 12 and 13 are conductive core materials fixed integrally to the through holes 10 and 11 and are formed to be flat at both ends and to have substantially the same thickness as that of the base substrate 2. This maintains the hermeticity of the cavity C and provides electrical continuity between both faces of the base substrate 2.

The through electrodes 12 and 13 are not limited to the above ones. For example, metal pins, not shown, may be inserted into the through holes 10 and 11 and then glass frit may be filled between the through holes 10 and 11 and the metal pins, followed by firing. Alternatively, a conductive adhesive agent may be embedded into the through holes 10 and 11.

A pair of routing electrodes 14 and 15 of a conductive material are patterned on the upper face of the base substrate 2 (the bonding face to which the lid substrate 3 is bonded). One routing electrode 14 of the pair of routing electrodes 14 and 15 is provided to cover the through electrode 12. The other routing electrode 15 of the pair of routing electrodes 14 and 15 covers the through electrode 13 at one end and extends in the longitudinal direction of the base substrate 2 to the position adjacent to the one routing electrode 14 at the other end.

A bump B (see FIG. 4) made of gold or the like is formed on the upper face of the pair of routing electrodes 14 and 15. The piezoelectric vibrating strip 5 is mounted such that a mount electrode, not shown, formed at the base portion 22 is in contact with the bump B. Thus, the piezoelectric vibrating strip 5 is supported at a spacing from the upper face of the base substrate 2 and is electrically connected to the routing electrodes 14 and 15.

External electrodes 16 and 17 electrically connected to the pair of through electrodes 12 and 13, respectively, are formed on the lower face of the base substrate 2.

(Piezoelectric Vibrating Strip)

Figure 5:
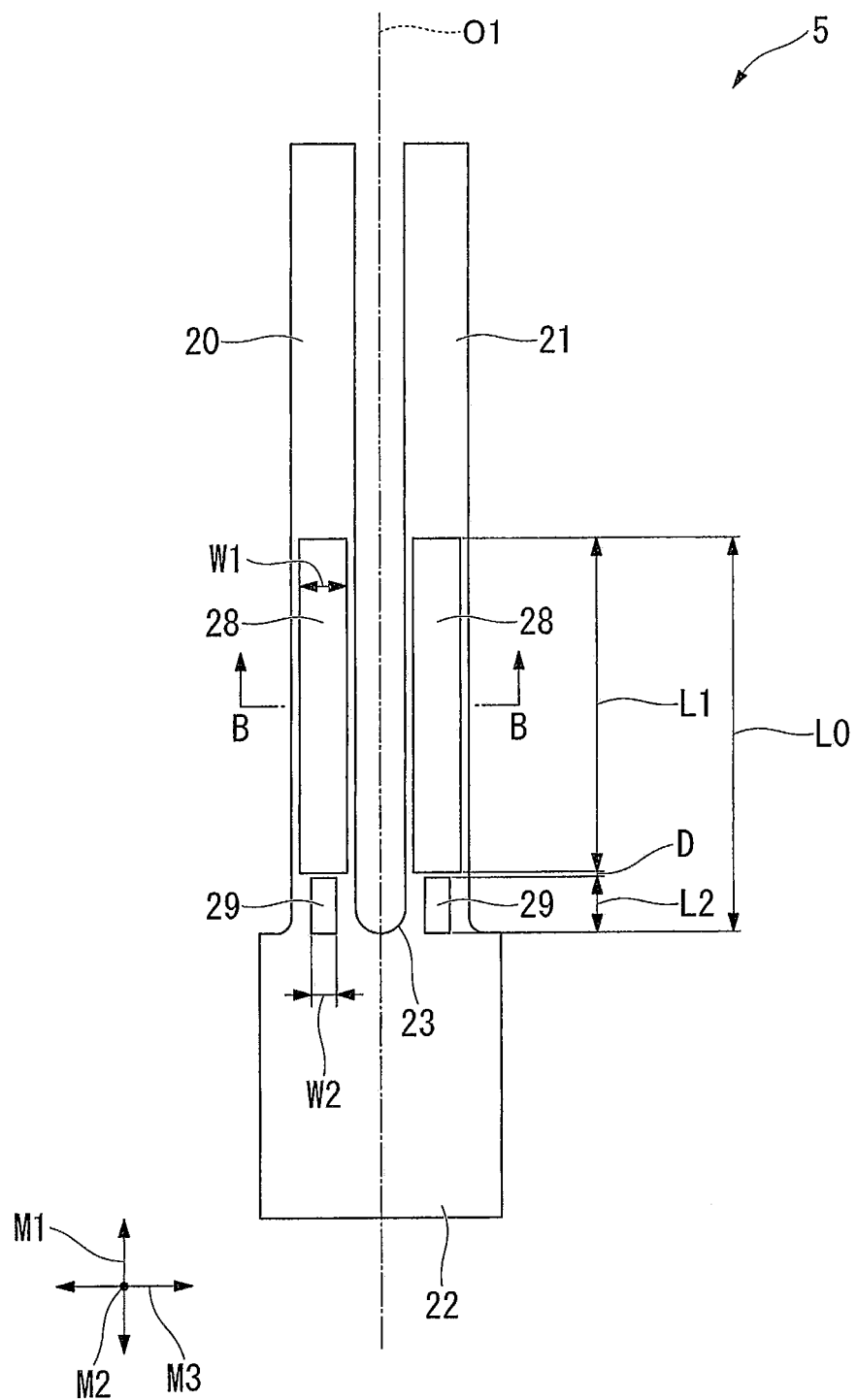
FIG. 5 is a top view of the piezoelectric vibrating strip forming part of the piezoelectric vibrator shown in FIG. 1.

As shown in FIG. 5, the piezoelectric vibrating strip 5 is a vibrating strip of a tuning fork type made of a piezoelectric material such as crystal, lithium tantalate, or lithium niobate, and includes the pair of vibrating arm portions 20 and 21 extending in parallel and having leading end portions as free ends, and the base portion 22 integrally cantilevering the base end portions (root portions) of the pair of vibrating arm portions 20 and 21.

Figure 4:
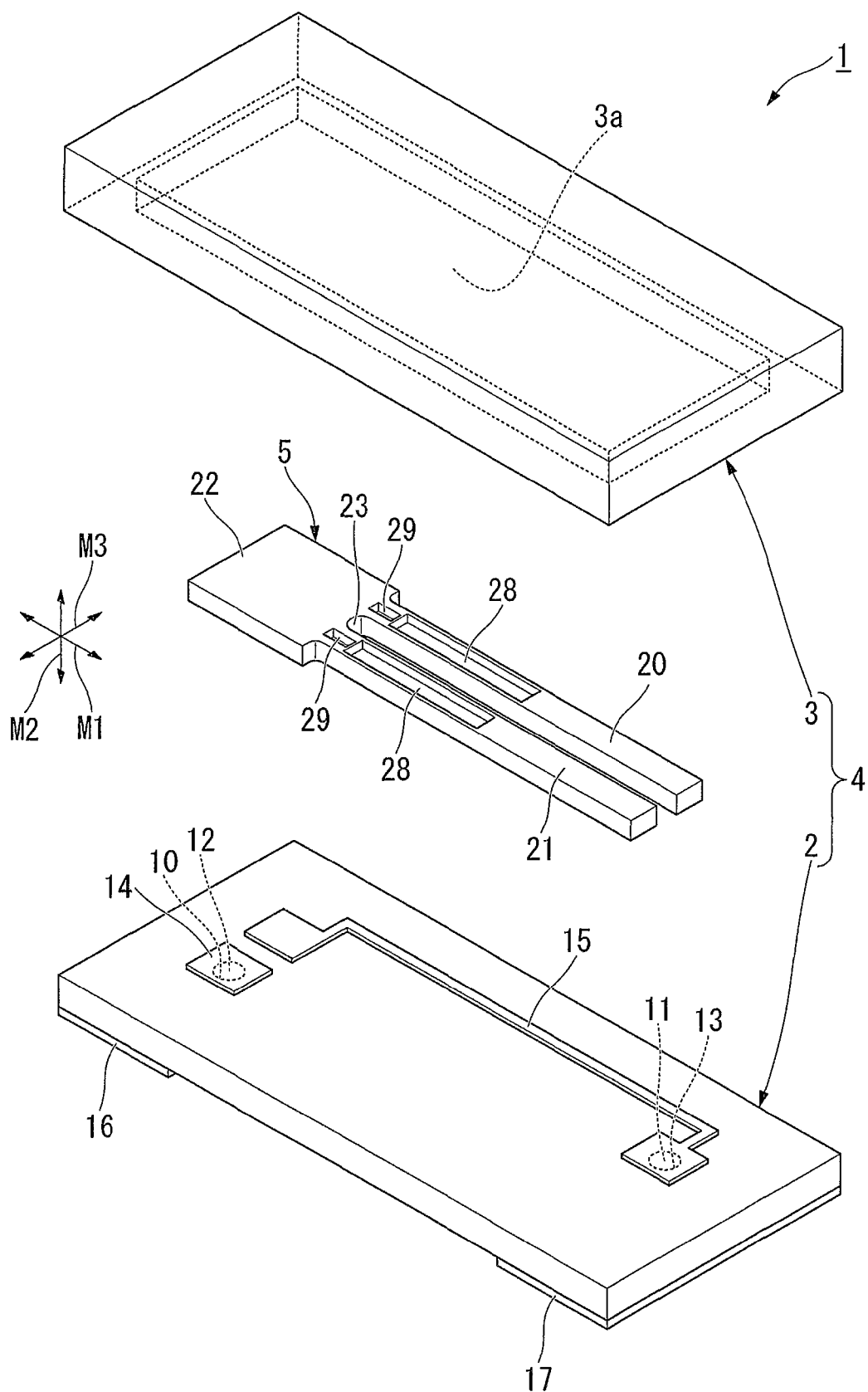
FIG. 4 is an exploded perspective view of the piezoelectric vibrator shown in FIG. 1.

In the present embodiment, as shown in FIG. 4 and FIG. 5, the direction in which the base end portions of the vibrating arm portions 20 and 21 are connected to the lead portions is referred to as a length direction M1, and the direction orthogonal to the length direction M1 and a thickness direction M2 of the piezoelectric vibrating strip 5 is referred to as a width direction M3.

As shown in FIG. 5, the pair of vibrating arm portions 20 and 21 are placed in line symmetry with respect to a central axis O1, have a certain width in the width direction M3, and extend along the central axis O1. The base portion 22 is a member which cantilevers the base end portions of the pair of vibrating arm portions 20 and 21 as described above and serves as a mount member in mounting the piezoelectric vibrating strip 5. A crotch 23 is located between the base end portions of the pair of vibrating arm portions 20 and 21.

The example shows the crotch 23 curved with a predetermined radius of curvature and thus having the ideal state formed in the shape of the letter U in planar view of the thickness direction M2.

Exciting electrodes 25 and 26 (see FIG. 6) for vibrating the pair of vibrating arm portions 20 and 21, respectively, are formed on the outer faces of the pair of vibrating arm portions 20 and 21. The mount electrode, not shown, electrically continuous with the exciting electrodes 25 and 26 is formed on the outer face of the base portion 22. When a predetermined voltage is applied to the exciting electrodes 25 and 26 through the mount electrode, the interaction between the exciting electrodes 25 and 26 vibrates the pair of vibrating arm portions 20 and 21 at a predetermined resonance frequency in the direction in which they are brought closer to or away from each other (the width direction M3).

A first groove portion 28 and a second groove portion 29 are formed on each of the main faces of the pair of vibrating arm portions 20 and 21 along the length direction M1 of the vibrating arm portions 20 and 21.

The second groove portions 29 is placed near the portions bonding the base end portions of the vibrating arm portions 20 and 21 to the base portion 22. More specifically, the portion of the second groove portion 29 closer to the base end portion is located at the portions bonding the base end portions of the vibrating arm portions 20 and 21 to the base portion 22 and is aligned with the bottom portion of the crotch 23 in the width direction M3.

The first groove portion 28 is placed with an interval D from the second groove portion 29 closer to the leading portions of the vibrating arm portions 20 and 21 than the second groove portion 29, and extends to near the intermediate portion of the vibrating arm portions 20 and 21 in the length direction M1.

The first groove portions 28 and the second groove portions 29 are formed at the center of each of the vibrating arm portions 20 and 21 in the width direction M3. Thus, the first groove portion 28 and the second groove portion 29 formed on the one vibrating arm portion 20 and the first groove portion 28 and the second groove portion 29 formed on the other vibrating arm portion 29 are placed in line symmetry with respect to the central axis O1.

A comparison between the first groove portion 28 and the second groove portion 29 shows that a groove width (a length along the width direction M) W2 of the second groove portion 29 located closer to the base end portions of the vibrating arm portions 20 and 21 is smaller than a groove width W1 of the first groove portion 28. Specifically, the groove width ratio of the groove width W2/the groove width W1 is set to be equal to or higher than 0.4 and lower than 1.0.

A groove length (a length along the length direction M1) L2 of the second groove portion 29 is formed to be smaller than a groove length L1 of the first groove portion 28. Specifically, assuming that L0 represents the total of the groove length L1, the interval D, and the groove length L2, the ratio of the groove length L2/the length L0 is set to be equal to or higher than 0.04 and equal to or lower than 0.3. The interval D is a gap of approximately several micrometers to ten and several micrometers.

Exemplary dimensions of the piezoelectric vibrating strip 5 that satisfy the above conditions include an overall length of 1.5 mm to 2.0 mm for the vibrating arm portions 20 and 21, an arm width of 100 µm to 120 µm, a groove width W1 of 80 µm to 90 µm for the first groove portion 28, a groove length L1 of 750 µm to 800 µm for the first groove portion 28, a groove width W2 of 35 µm to 75 µm for the second groove portion 29, a groove length L2 of 50 µm to 100 µm for the second groove portion 29, and a length L0 of 800 µm to 900 µm.

In this manner, in the piezoelectric vibrating strip 5 of the present embodiment, the first groove portion 28 located closer to the leading end portions of the vibrating arm portions 20 and 21 is formed to have the larger groove width and the larger groove length than those of the second groove portion 29 located closer to the base end portions. Consequently, the first groove portion 28 makes a more effective contribution toward improving the electric field efficiency, that is, toward reducing the CI value than the second groove portion 29.

Figure 6:
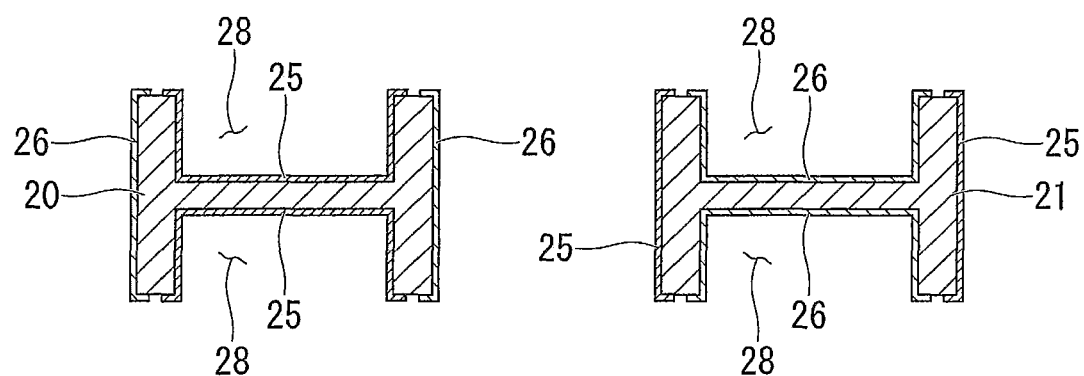
FIG. 6 a section view taken along a line B-B in FIG. 5.

The exciting electrodes 25 and 26 patterned as shown in FIG. 6 are formed on the sides of the first groove portion 28 and the second groove portion 29. Specifically, one exciting electrode 25 is formed mainly on the first groove portion 28 of one vibrating arm portion 20 and on both sides of the other vibrating arm portion 21, whereas the other exciting electrode 26 is formed mainly on both sides of one vibrating arm portion 20 and on the first groove portion 28 of the other vibrating arm portion 21.

Although the first groove portion 28 is used as the example, the same applies to the second groove portion 29.

(Operation of Piezoelectric Vibrator)

For operating the piezoelectric vibrator 1 configured as described above, a predetermined driving voltage is applied to the external electrodes 16 and 17 formed on the base substrate 2. This can pass an electric current through the exciting electrodes 25 and 26 on the piezoelectric vibrating strip 5 to vibrate the pair of vibrating arm portions 20 and 21 at a predetermined frequency in the direction in which they are brought closer to or away from each other. The vibrations of the pair of vibrating arm portions 20 and 21 can be used to achieve the application of the piezoelectric vibrator 1 as the time source, the timing source for a control signal, the reference signal source or the like.

With the piezoelectric vibrating strip 5 of the present embodiment, the two groove portions, that is, the first groove portion 28 and the second groove portion 29 are formed on each of the pair of vibrating arm portions 20 and 21, so that the exciting electrodes 25 and 26 formed on the outer faces of the vibrating arm portions 20 and 21 can be opposed to each other on the sides of the first groove portion 28 and the second groove portion 29 as shown in FIG. 6 to increase the electric field efficiency and reduce the CI value. As a result, the size reduction can be achieved such as the reduced width of the vibrating arm portions 20 and 21 with the vibration characteristics maintained.

Particularly, as shown in FIG. 5, the groove width W2 of the second groove portion 29 located closer to the base end portions of the vibrating arm portions 20 and 21 is formed to be smaller than the groove width W1 of the first groove portion 28, and the groove width ratio of the groove width W2/the groove width W1 is set to be equal to or higher than 0.4 and lower than 1.0. This can suppress a reduction in rigidity at the base end portions of the vibrating arm portions 20 and 21 where stress is easily concentrated, which can suppress a reduction in rigidity of the overall vibrating arm portions 20 and 21.

As a result, the CI value can be reduced while suppressing the reduced rigidity of the vibrating arm portions 20 and 21, thereby providing the piezoelectric vibrating strip 5 which can be reduced in size with excellent vibration characteristics and high resistance to shock. Particularly, since the reduced rigidity is suppressed at the base end portions of the vibrating arm portions 20 and 21, vibration leaks or the like can be suppressed.

Since the ratio of the groove length L2 of the second groove portion 29/the length L0 is set to be equal to or higher than 0.04 and equal to or lower than 0.3, the first groove portion 28 with the groove width larger than that of the second groove portion 29 can have the larger groove length. Thus, the first groove portion 28 with the larger groove width can contribute more to reducing the CI value to accomplish the reduction in the CI value reliably.

Since the second groove portions 29 are formed on the pair of vibrating arm portions 20 and 21 so as to locate in line symmetry with respect to the central axis O1 disposed between the pair of vibrating arm portions 20 and 21, the pair of vibrating arm portions 20 and 21 can be vibrated uniformly in the direction in which they are brought closer to or away from each other. This can prevent an increase in the CI value, vibration leaks and the like, to further improve the vibration characteristics.

If the ratio of the groove width W2 of the second groove portion 29/the groove width W1 of the first groove portion 28 is lower than 0.4, the precise formation of the second groove portion 29 is difficult, and the electric field efficiency in the second groove portion 29 may be reduced to increase the CI value.

If the ratio of the groove length L2 of the second groove portion 29/the length L0 is lower than 0.04, the second groove portion 29 is too short to contribute to reducing the CI value, and the CI value may be increased. On the other hand, if the ratio of the groove length L2 of the second groove portion 29/the length L0 is higher than 0.3, the first groove portion 28 with the large width effectively contributing to reducing the CI value is reduced in length, so that the CI value may also be increased.

With the piezoelectric vibrator 1 of the present embodiment, since the piezoelectric vibrating strip 5 which can be reduced in size with excellent vibration characteristics and high resistance to shock is included, the resulting piezoelectric vibrator 1 can have high quality with improved reliability and durability in operation.

(Modification)

Although the second groove portions 29 are placed in line symmetry with respect to the central axis O1 in the present embodiment, the present invention is not limited thereto and an asymmetric arrangement may be used. However, the line symmetry arrangement is preferred since the base end portion of one vibrating arm portion 20 and the base end portion of the other vibrating arm portion 21 can have uniform rigidity, and the pair of vibrating arm portions 20 and 21 can be vibrated uniformly.

Figure 7:
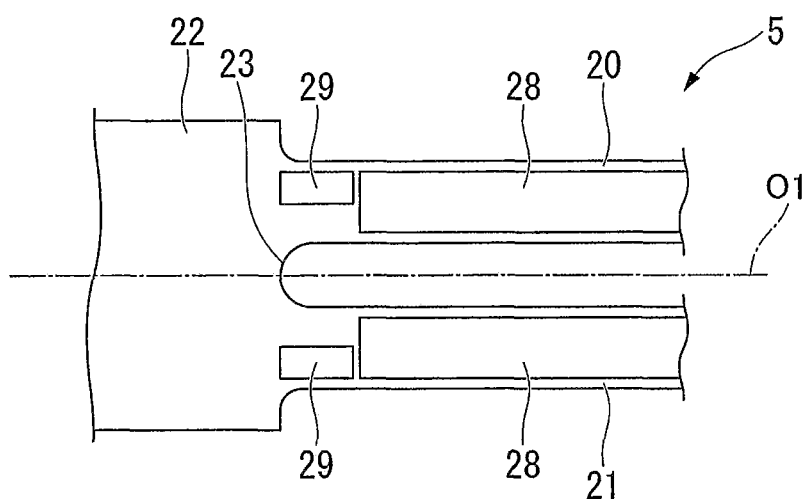
FIG. 7 is a diagram showing a modification of the piezoelectric vibrating strip and illustrates an exemplary arrangement in which a second groove portion is offset outward in the width direction of a vibrating arm portion.

When the second groove portions 29 are placed in line symmetry with respect to the central axis O1, the second groove portion 29 is placed at the centers of the vibrating arm portions 20 and 21 in the width direction M3 in the embodiment, the present invention is not limited thereto. For example, as shown in FIG. 7, the second groove portions 29 can be placed at the positions offset outward by the same amount from the centers in the width direction M3. In this case, the pair of vibrating arm portions 20 and 21 can also be vibrated uniformly.

Alternatively, the second groove portions 29 may be placed at the positions offset inward in the width direction M3 by the same amount.

In the embodiment, the second groove portion 29 may be placed in view of the etching residue inevitably formed in processing at the crotch 23 of the piezoelectric vibrating strip 5.

The outer shape of the piezoelectric vibrating strip 5 is generally formed by wet etching of a wafer of crystal or the like, and in the etching, so-called etching anisotropy is exhibited in which the etching rate varies depending on the crystal axis direction. Typically, the wafer is cut from crystal ore such that the Z axis of the crystal axis corresponds to the thickness direction M2 of the piezoelectric vibrating strip 5, the Y axis corresponds to the length direction M1 of the piezoelectric vibrating strip 5, and the X axis corresponds to the width direction M3 of the piezoelectric vibrating strip 5, so that the etching anisotropy produces the etching residue at the crotch 23. In addition, the production of the etching residue is localized to a portion closer to one vibrating arm portion 20 (21). When an external shock or the like is given, the vibrating arm portion 20 (21) closer to the etching residue is subjected to cracks and the like originating from the etching residue.

Figure 8:
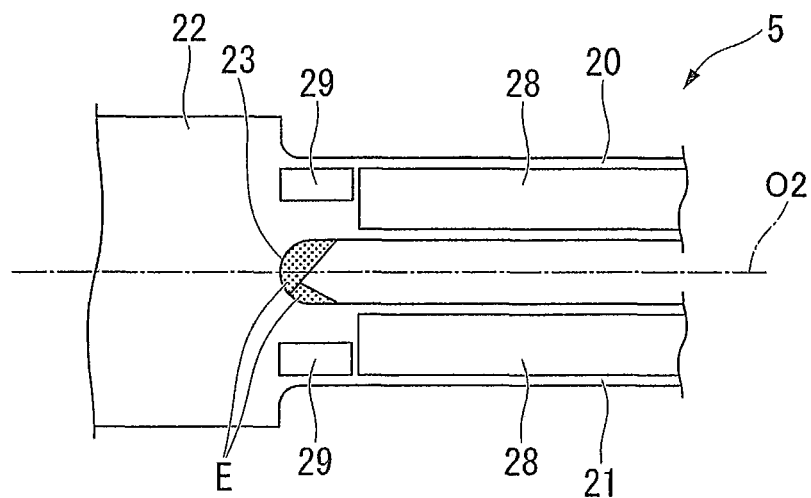
FIG. 8 is a diagram showing a modification of the piezoelectric vibrating strip and illustrates an exemplary arrangement in which the second groove portions are placed in linear symmetry with respect to a virtual central axis in view of an etching residue.

To address this, as shown in FIG. 8, the second groove portions 29 may be placed in line symmetry with respect to a virtual central axis 02 dividing an etching residue E into two in the width direction M3 (divides the volume of the etching residue E into two in the width direction M3) and extending in the length direction M1.

This configuration can prevent the formation of the second groove portion 29 near the etching residue E to suppress the creation of the cracks. In addition to the uniform vibrations of the pair of vibrating arm portions 20 and 21, the vibrating arm portions 20 and 21 can be effectively prevented from breaking near the base end portions.

It should be noted that FIG. 8 exaggeratedly shows the etching residue E.

The outer shape of the piezoelectric vibrating strip 5 is not limited to the shape in the embodiment and may be changed as appropriate.

Figure 9:
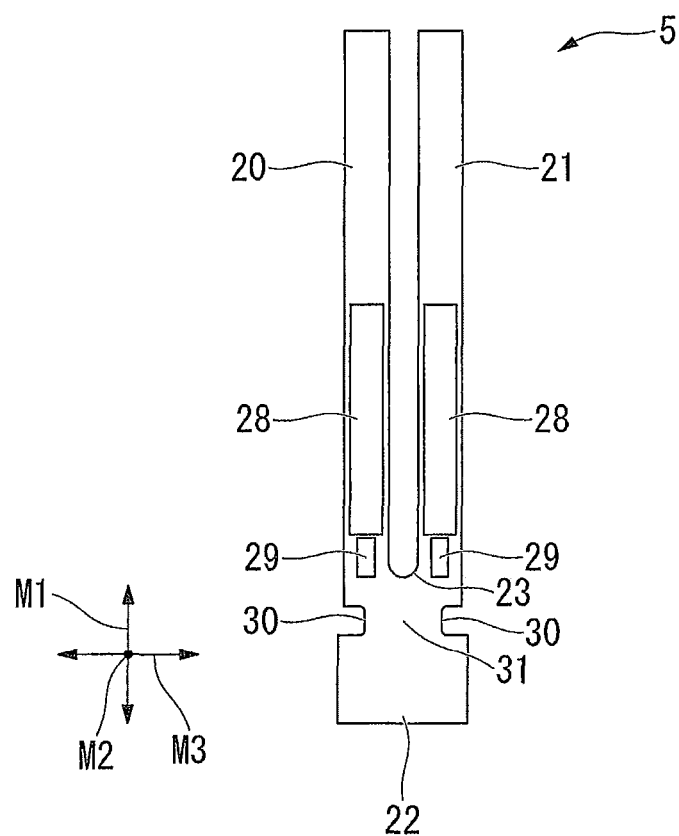
FIG. 9 is a diagram showing a modification of the piezoelectric vibrating strip and illustrates an example in which a notch portion is formed in a base portion.

For example, as shown in FIG. 9, the piezoelectric vibrating strip 5 may be of a so-called notch type in which a notch portion 30 (notch) is formed in the base portion 22 near the portion connecting to the based end portions of the vibrating arm portions 20 and 21 from each side in the width direction M3 toward the center in the width direction M3.

The notch portion 30 is opened outward in the width direction M3 and passes through the base portion 22 in the thickness direction M2. Thus, the base portion 22 has a constricted shape formed as a narrowed portion 31 having a width smaller than that of the remaining portion near the portion connecting to the base end portions of the vibrating arm portions 20 and 21. Since the narrowed portion 31 formed by the notch portion 30 can narrow the route through which the vibrations excited by the vibrating arm portions 20 and 21 are transferred toward the base portion 22, the vibrations can be confined to the vibrating arm portions 20 and 21 to easily suppress leaks thereof toward the base portion 22. This can effectively reduce the vibration leaks and effectively suppress an increase in the CI value.

Figure 10:
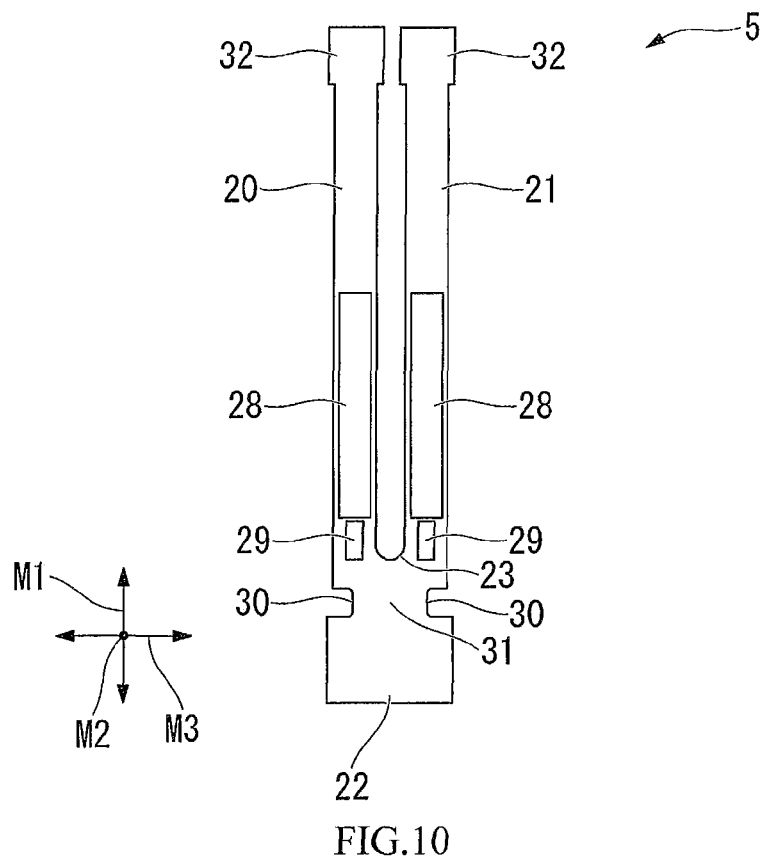
FIG. 10 is a diagram showing a modification of the piezoelectric vibrating strip and illustrates an example in which a leading end portion of the vibrating arm portion is increased in width.

As shown in FIG. 10, the piezoelectric vibrating strip 5 may be of a so-called hammer head type in which a hamper portion 32 is formed at the leading end portion of each of the vibrating arm portions 20 and 21 to have a width larger than that of the base end portion.

The hammer portion 32 can increase the weight of the leading end portions of the vibrating arm portions 20 and 21 to increase the moment of inertia during vibration. This can easily vibrate the vibrating arm portions 20 and 21, and can reduce the length of the vibrating arm portions 20 and 21 accordingly to facilitate a further reduction in size.

Figure 11:
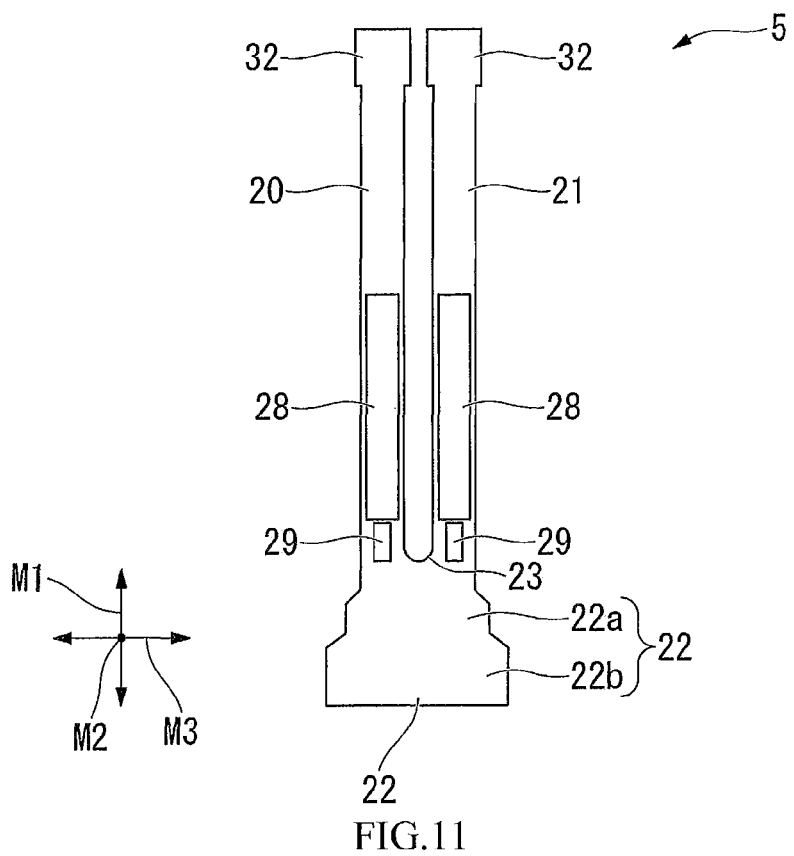
FIG. 11 is a diagram showing a modification of the piezoelectric vibrating strip and illustrates an example in which the width of the base portion is increased stepwise.

As shown in FIG. 11, the base portion 22 may be widened stepwise from the portion connecting to the base end portions of the vibrating arm portions 20 and 21 toward the other end portions.

Specifically, the base portion 22 has a first base portion 22a closer to the connecting portion and a second base portion 22b coupled to the first base portion 22a on the side closer to the other end portion and increased in width as compared with the first base portion 22a (so-called two-stage base portion type).

Inclined surfaces are formed on the portion connecting the first base portion 22a to the base end portions of the vibrating arm portions 20 and 21 and the portion connecting the first base portion 22a to the second base portion 22b such that the width is gradually increased from the connecting portion to the other end portion along the length direction M1.

Since this configuration allows the first base portion 22a with the reduced width to narrow the route through which the vibrations excited by the vibrating arm portions 20 and 21 are transferred toward the second base portion 22b, the vibrations can be confined to the vibrating arm portions 20 and 21 to easily suppress leaks thereof toward the second base portion 22b. This can effectively reduce the vibration leaks and suppress an increase in the CI value. The volume of the base portion 22 can be increased without changing the overall length thereof, and the second base portion 22b with the increased width can be used for mounting, so that the mountability can be improved.

Figure 12:
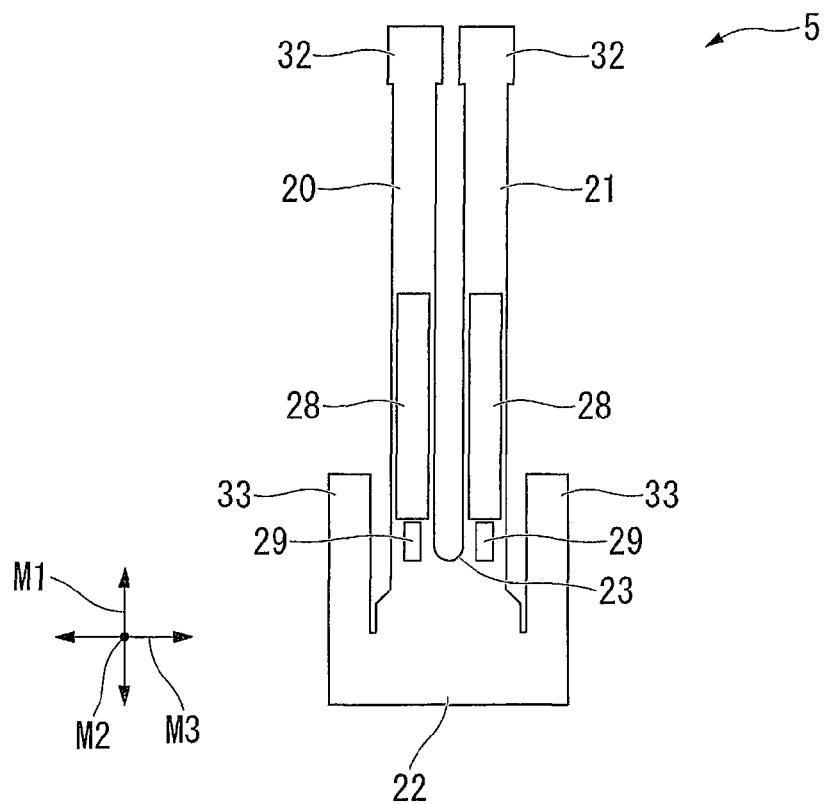
FIG. 12 is a diagram showing a modification of the piezoelectric vibrating strip and illustrates an example in which a side arm is provided on the base portion.

As shown in FIG. 12, the piezoelectric vibrating strip 5 may be of a side arm type in which a pair of side arms 33 extending along the length direction M1 are formed integrally with the base portion 22 on both sides of the base portion 22 in the width direction M3.

Specifically, each of the side arms 33 extends along from the other end portion of the base portion 22 toward each side in the width direction M3 and extends from the outer end portion toward the vibrating arm portions 20 and 21 along the length direction M1. In other words, the side arm 33 is located on each side of the base portion 22 and the base end portions of the vibrating arm portions 20 and 21 in the width direction M3, and the leading end portion of the side arm 33 is located on the side of the first groove portion 28.

In this case, the leading end portion of the side arm 33 can serve as a mount portion which can be used for installation on the package 4, for example.

Since this configuration can ensure the long distance in the base portion 22 between the portion connecting to the vibrating arm portions 20 and 21 and the mount portion (leading end portion of the side arm 33), the vibration leaks can be prevented to suppress an increase in the CI value without increasing the overall length of the piezoelectric vibrating strip 5.

Figure 13:
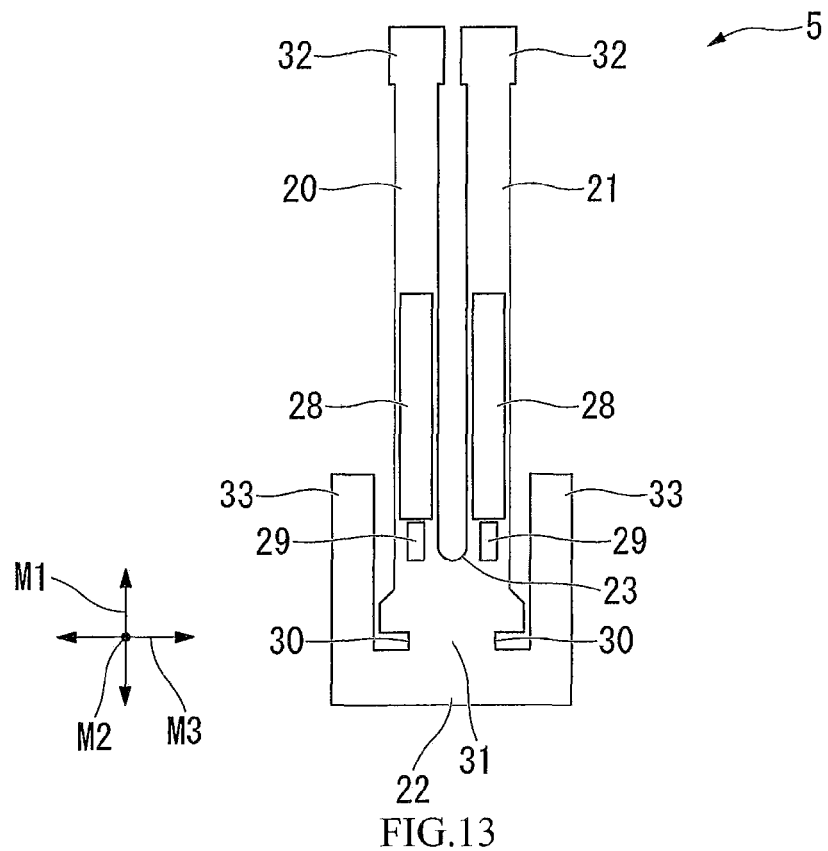
FIG. 13 is a diagram showing a modification of the piezoelectric vibrating strip and illustrates an example in which the notch portion and the side arm are provided on the base portion.

As shown in FIG. 13, the configuration (side arm type) including the side arm 33 shown in FIG. 12 may be combined with the configuration (notch type) having the notch portion 30 formed in the base portion 22 shown in FIG. 9.

Figure 14:
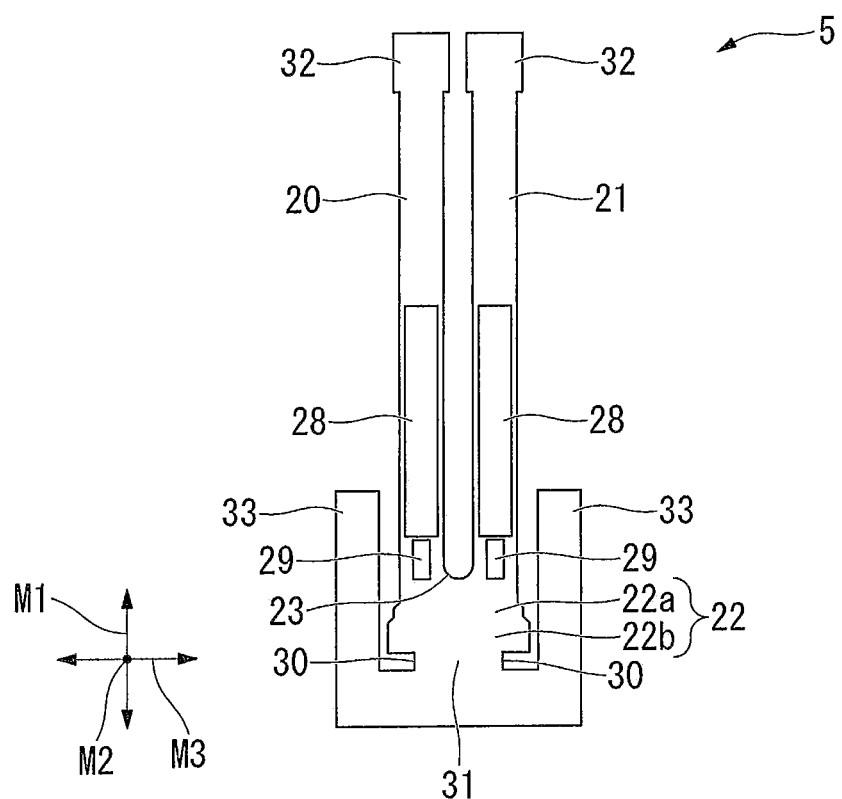
FIG. 14 is a diagram showing a modification of the piezoelectric vibrating strip and illustrates an example in which the notch portion, the staged portion, and the side arm are provided on the base portion.

In addition, as shown in FIG. 14, the configuration including the side arm 33 and the notch portion 30 shown in FIG. 13 may be combined with the configuration (two-stage base portion type) having the base portion 22 formed of the first base portion 22a and the second base portion 22b shown in FIG. 11.

(Oscillator)

Next, an embodiment of an oscillator according to the present invention will be described with reference to FIG. 15.

Figure 15:
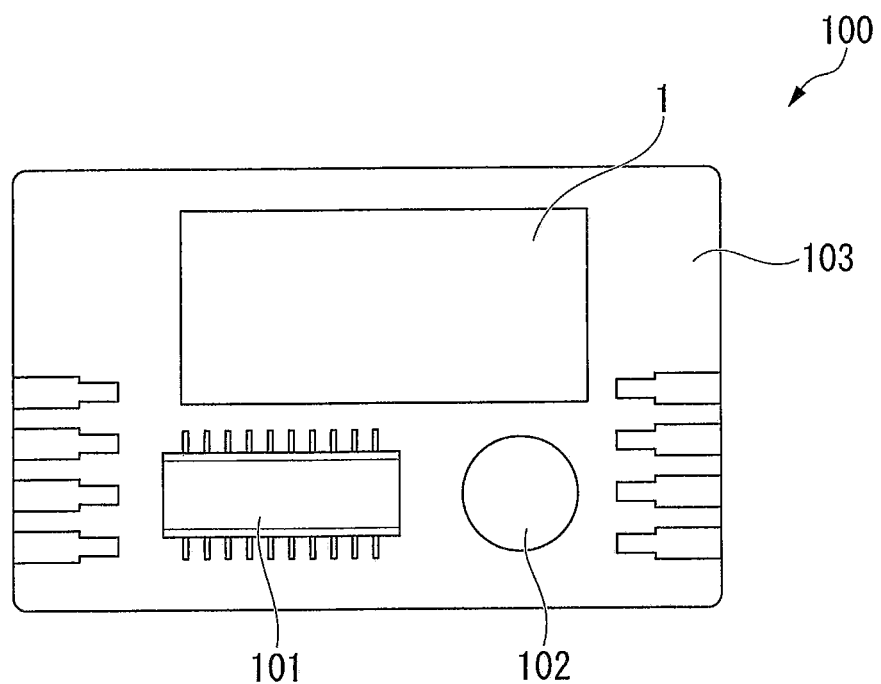
FIG. 15 is a schematic diagram showing an embodiment of an oscillator according to the present invention.

As shown in FIG. 15, an oscillator 100 in the present embodiment includes the piezoelectric vibrator 1 provided as an oscillator electrically connected to an integrated circuit 101. The oscillator 100 includes a substrate 103 on which an electronic part 102 such as a capacitor is mounted. The abovementioned integrated circuit 101 for the oscillator is mounted on the substrate 103, and the piezoelectric oscillator 1 is mounted near the integrated circuit 101. The electronic part 102, the integrated circuit 101, and the piezoelectric vibrator 1 are connected electrically to each other through a wiring pattern, not shown. Each of the components is molded with a resin, not shown.

In the oscillator 100 formed in this manner, when a voltage is applied to the piezoelectric vibrator 1, the piezoelectric vibrating strip 5 within the piezoelectric vibrator 1 vibrates. The vibrations are converted into an electric signal through the piezoelectric property provided by the piezoelectric vibrating strip 5 and are input as the electric signal to the integrated circuit 101. The input electric signal is subjected to various types of processing in the integrated circuit 101 and is output as a frequency signal. The piezoelectric vibrator 1 serves as the oscillator in this manner.

When the configuration of the integrated circuit 101 is selectively set as needed for a RTC (Real Time Clock) module or the like, additional functions can be provided such as control of the operation day or time of the device and an external device, provision of time or calendar and the like in addition to the single-function oscillator for clock.

As described above, according to the oscillator 100 of the present embodiment, the piezoelectric vibrator 1 is included, so that the oscillator 100 can be provided with improved reliability and durability in operation.

(Electronic Device)

Figure 16:
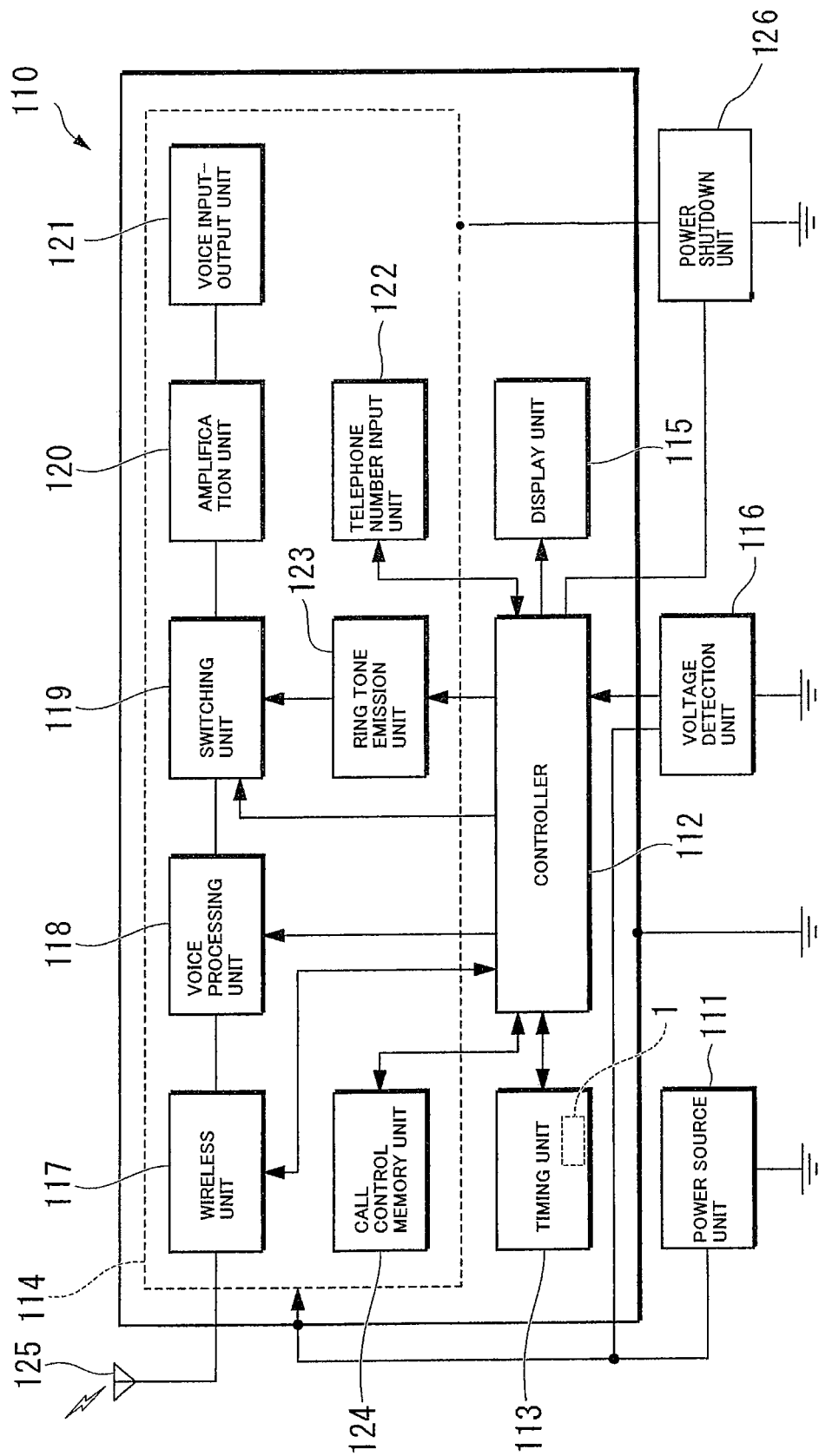
FIG. 16 is a schematic diagram showing an embodiment of an electronic device according to the present invention.

Next, an embodiment of an electronic device according to the present invention will be described with reference to FIG. 16. The electronic device is described by using a portable information device (electronic device) 110 having the piezoelectric vibrator 1 described above as an example.

The portable information device 110 in the present embodiment is represented by a cellular phone, for example, and is provided by enhancing and improving a wristwatch in the related art. The outer appearance is similar to that of the wristwatch with a liquid crystal display placed on a portion corresponding to a dial, and the current time or the like can be displayed on the screen. For use as a communication device, the device can be removed from the wrist and communication can be performed similarly to the cellular phone in the related art by using a speaker and a microphone contained in a band. However, the device is significantly reduced in size and weight as compared with the conventional cellular phone.

Next, the configuration of the portable information device 110 in the present embodiment will be described. As shown in FIG. 16, the portable information device 110 includes the piezoelectric vibrator 1 and a power source section 111 for supplying the power. The power source section 111 is formed of a lithium-ion secondary battery, by way of example. The power source section 111 is connected in parallel to a control section 112 for performing various types of control, a time measuring section 113 for counting time or the like, a communicating section 114 for performing communication with the outside, a display section 115 for displaying various types of information, and a voltage detecting section 116 for detecting the voltage of each of functioning sections. The power source section 111 supplies the power to each of the functioning sections.

The control section 112 performs the operation control of the overall system by controlling each of the functioning sections to transmit and receive voice data, and to measure and display the current time. The control section 112 includes a ROM having previously written programs, a CPU for reading and executing the programs written into the ROM, and a RAM used as a work area for the CPU and the like.

The time measuring section 113 includes an integrated circuit containing an oscillating circuit, a register circuit, a counter circuit, and an interface circuit, and the piezoelectric vibrator 1. When a voltage is applied to the piezoelectric vibrator 1, the piezoelectric vibrating strip 5 vibrates, and the vibrations are converted into an electric signal through the piezoelectric property provided by the crystal and are input as the electric signal to the oscillating circuit. The output from the oscillating circuit is binarized and measured by the register circuit and the counter circuit. Then, the signal is transmitted and received to and from the control section 112 through the interface circuit to display the current time, the current date, the calendar information and the like on the display section 115.

The communicating section 114 has the function similar to that of the conventional cellular phone, and includes a radio section 117, a voice processing section 118, a switching section 119, an amplifying section 120, a voice input/output section 121, a telephone number input section 122, a ringtone generating section 123, and a call control memory section 124.

The radio section 117 transmits and receives various types of data such as voice data to and from a base station through an antenna 125. The voice processing section 118 codes and decodes a voice signal input from the radio section 117 or the amplifying section 120. The amplifying section 120 amplifies a signal input from the voice processing section 118 or the voice input/output section 121 to a predetermined level. The voice input/output section 121 is formed of a speaker, a microphone or the like, and turns up the ringtone or received voice or collects the voice.

The ringtone generating section 123 generates a ringtone in response to a call from the base station. The switching section 119 switches the amplifying section 120 connected to the voice processing section 118 to the ringtone generating section 123 only at the time of an incoming call such that the ringtone generated in the ringtone generating section 123 is output to the voice input/output section 121 through the amplifying section 120.

The call control memory section 124 stores a program associated with control of outgoing/incoming calls in communication. The telephone number input section 122 includes numeric keys from zero to nine and other keys, for example, and these numeric keys or the like can be pressed to input the telephone number of a called party or the like.

When the voltage applied by the power source section 111 to each of the functioning sections such as the control section 112 falls below a predetermined value, the voltage detecting section 116 detects the voltage drop and notifies the control section 112 of the voltage drop. The predetermined voltage value is a previously set value as a minimum voltage required for stably operating the communicating section 114, and is approximately 3 V, by way of example. Upon reception of the notification of the voltage drop from the voltage detecting section 116, the control section 112 prohibits the operations of the radio section 117, the voice processing section 118, the switching section 119, and the ringtone generating section 123. Especially, the stop of the operation of the radio section 117 consuming large power is essential. In addition, the fact that the communicating section 114 is disabled due to lack of remaining battery power is displayed on the display section 115.

Specifically, the voltage detecting section 116 and the control section 112 can prohibit the operation of the communication section 114 and display the fact on the display section 115. This display may be performed with a text message, or by indicating x (small cross) on a telephone icon displayed in an upper portion on the display face of the display section 115 as a more intuitive display.

A power source shutdown section 126 capable of selectively shutting down the power source for the sections associated with the function of the communicating section 114 can be provided to stop the function of the communicating section 114 more reliably.

As described above, according to the portable information device 110 of the present embodiment, the piezoelectric vibrator 1 described above is included, so that the portable information device 110 can be provided with improved reliability and durability in operation.

(Radio Timepiece)

Next, an embodiment of a radio timepiece according to the present invention will be described with reference to FIG. 17.

Figure 17:
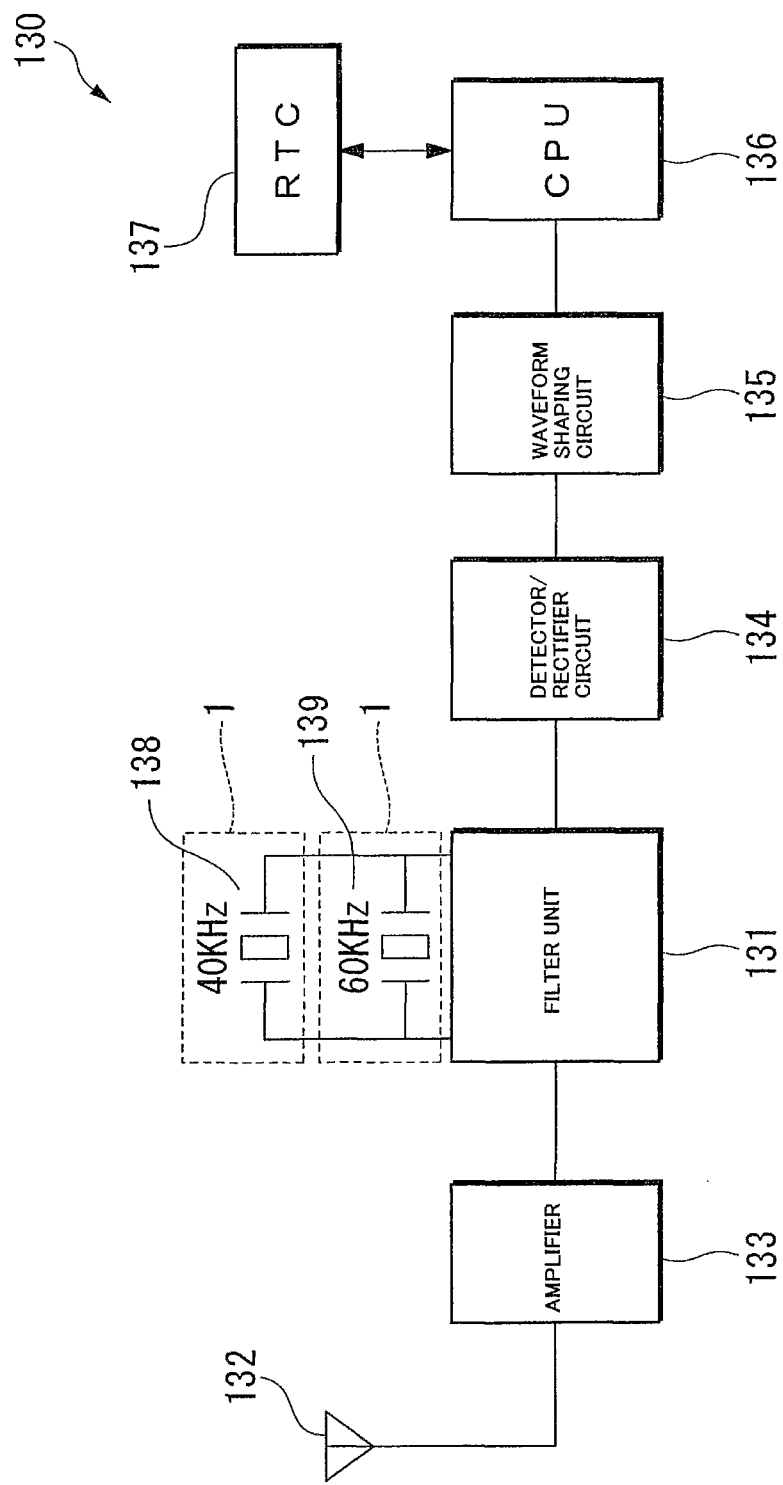
FIG. 17 is a schematic diagram showing an embodiment of a radio timepiece according to the present invention.

As shown in FIG. 17, a radio timepiece 130 of the present embodiment includes the piezoelectric vibrator 1 connected electrically to a filter section 131, and is a timepiece which has the function of receiving standard radio waves including timepiece information, automatically correcting the information to an accurate time, and displaying the time.

In Japan, transmitters (transmitting stations) for transmitting the standard radio waves are present in Fukushima prefecture (for 40 kHz) and Saga prefecture (for 60 kHz) and transmit the standard radio waves. Long wave such as 40 kHz or 60 kHz has both the nature of propagating on the ground and the nature of propagating on the ionosphere and the ground while reflecting, so that it has a wide propagation range and thus the abovementioned two transmitters cover all over Japan.

The functional configuration of the radio timepiece 130 will hereinafter be described in detail.

An antenna 132 receives the standard long wave at 40 kHz or 60 kHz. The standard long wave is provided by amplitude-modulating a carrier wave at 40 kHz or 60 kHz with the time information called a time code. The received standard long wave is amplified by an amplifier 133 and then filtered and synchronized by the filter section 131 having a plurality of piezoelectric vibrators 1. The piezoelectric vibrator 1 in the present embodiment includes crystal vibrator sections 138 and 139 having resonance frequencies at 40 kHz and 60 kHz identical to the abovementioned carrier frequencies.

The filtered signal at a predetermined frequency is then detected and demodulated by a detecting/rectifying circuit 134. Subsequently, the time code is taken through a waveform shaping circuit 135 and is counted by a CPU 136. The CPU 136 reads the information such as the current year, total days, day of a week, time and the like. The read information is reflected in an RTC 137 to display accurate time information.

Since the carrier wave is at 40 kHz or 60 kHz, the vibrator having the structure of the tuning fork type described above is preferable as the crystal vibrator sections 138 and 139.

While the above description is made with the example in Japan, the standard long wave has a different frequency in foreign countries. For example, the standard radio wave has a frequency of 77.5 kHz in Germany. Thus, to incorporate the radio timepiece 130 which can be used overseas into the portable device, the piezoelectric vibrator 1 for a frequency different from that in Japan is necessary.

As described above, according to the radio timepiece 130 of the present embodiment, the piezoelectric vibrator 1 is included, so that the radio timepiece 130 can be provided with improved reliability and durability in operation.

Although the embodiment of the present invention has been described with reference to the drawings, the present invention is not limited to those embodiments, and various modifications such as design changes can be made without departing from the spirit or scope of the present invention.

For example, the piezoelectric vibrating strip 5 according to the present invention is employed in the piezoelectric vibrator 1 of the surface mounting type in the embodiment described above. However, the present invention is not limited thereto, and a piezoelectric vibrator of a ceramic package type or a piezoelectric vibrator of a cylinder package type may be fixed in a mold resin section to provide the vibrator of the surface mounting type.

Although the embodiment has been described with the case where the bump B of gold or the like is used to mount the piezoelectric vibrating strip 5, the present invention is not limited thereto, and a conductive adhesive agent may be used for mounting.

EXAMPLE

Description is made of an example in which changes in vibration leaks and CI value were analyzed when the groove width W1 and the groove length L1 in the first groove portion 28, the groove width W2 and the groove length L2 in the second groove portion 29, and the interval D between the first groove portion 28 and the second groove portion 29 were changed in the piezoelectric vibrating strip 5 of the embodiment.

<First Analysis Test>

First, the interval D between the first groove portion 28 and the second groove portion 29 was set to 5 μm, and the length L0 consisting of the groove length L1 of the first groove portion 28, the groove length L2 of the second groove portion 29, and the interval D was set to 858 μm. When the ratio of the groove width W2 of the second groove portion 29/the groove width W1 of the first groove portion 28 takes the following three patterns, the changes in the vibration leaks and the CI value were analyzed before and after the mount of the piezoelectric vibrating strip 5.

(1) W2/W1 set to near 0.6
(2) W2/W1 set to near 0.8
(3) W2/W1 set to 1.0

In these patterns, the analysis was performed while the groove length L2 of the second groove portion 29 was changed to 50 μm (L2/L0 of 0.058), 75 μm (L2/L0 of 0.087), and 100 μm (L2/L0 of 0.116).

Figure 18A:
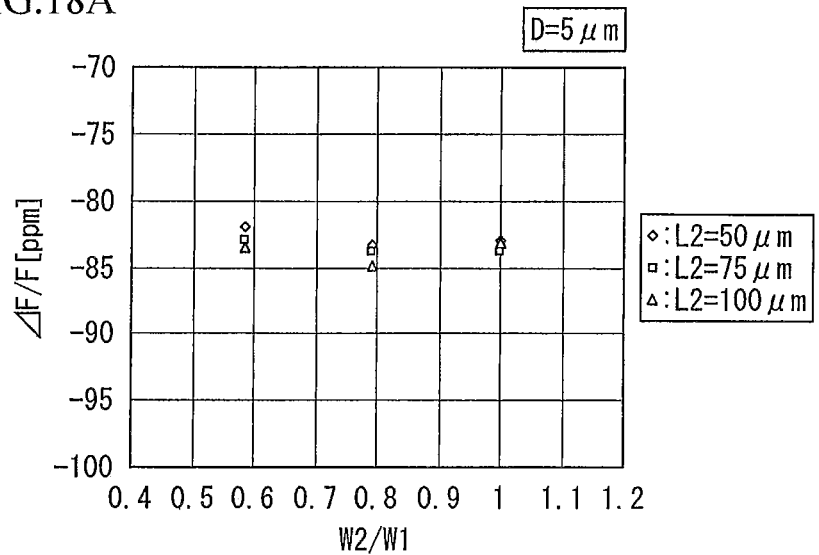
Figure 18B:
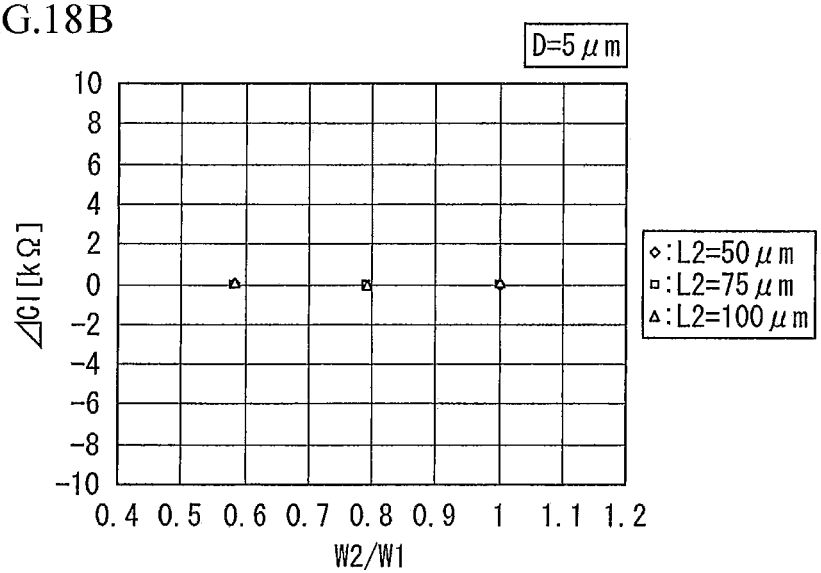
Figure 18C:
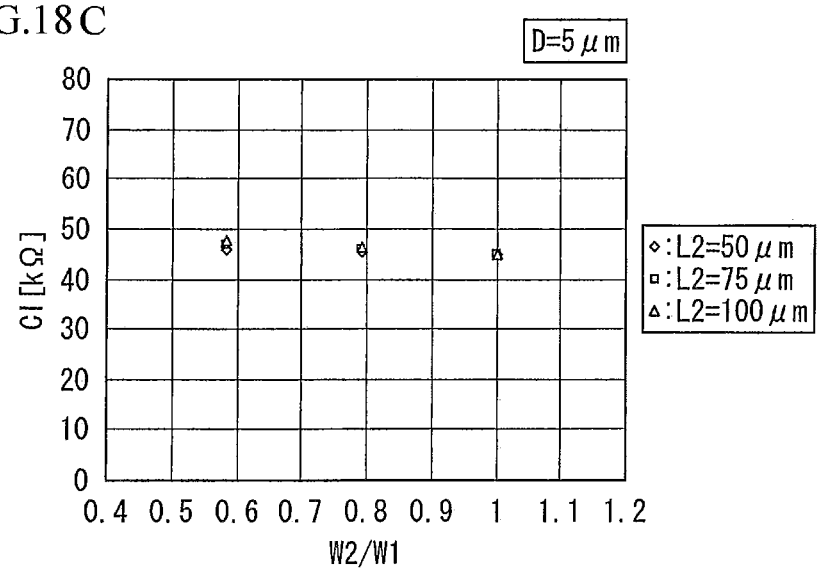
Figure 19A:
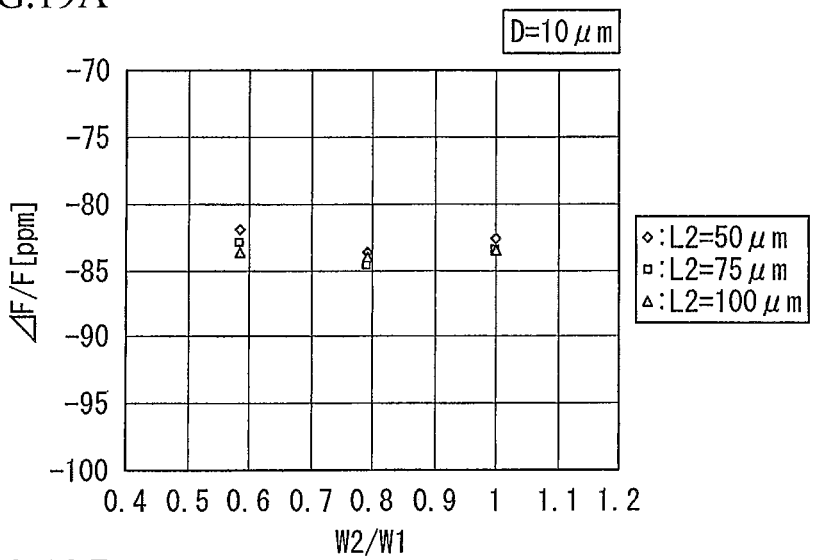
Figure 19:
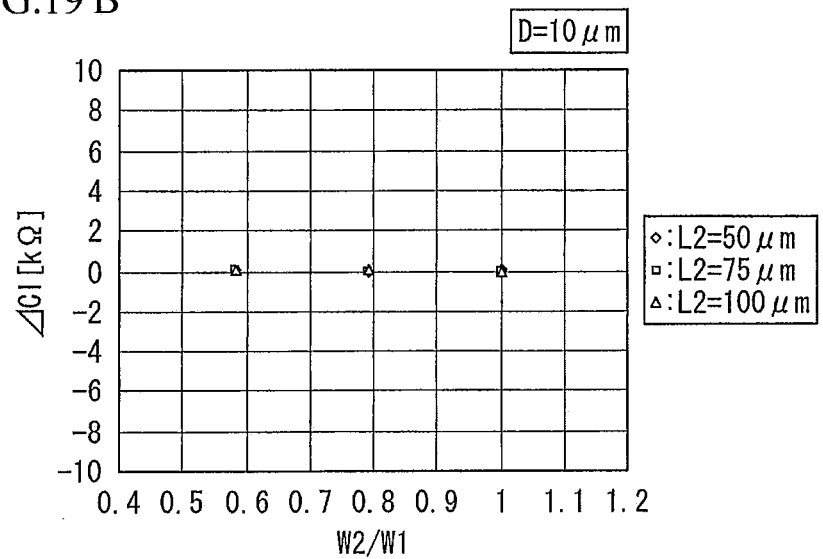
Figure 19C:
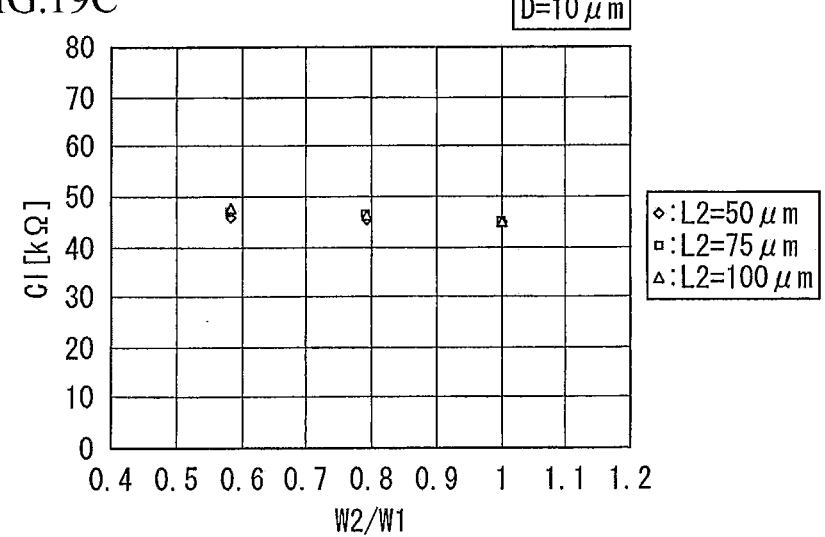
Figure 20A:
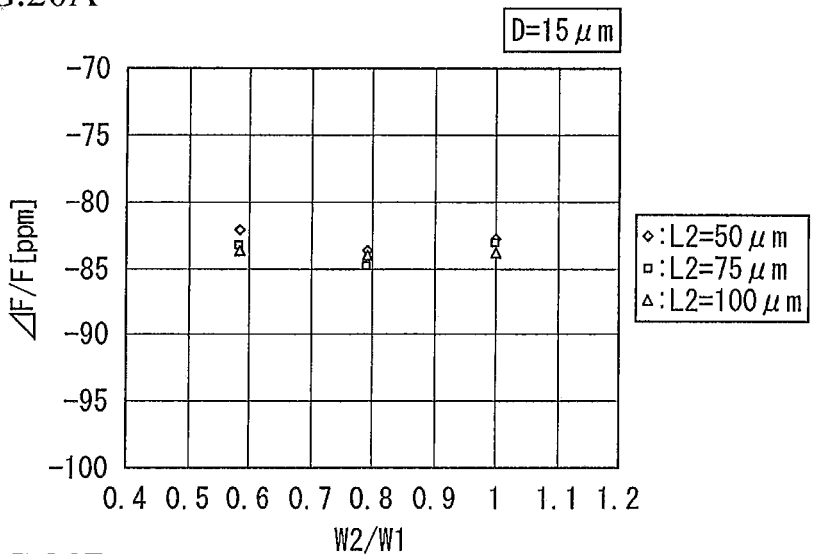
Figure 20B:
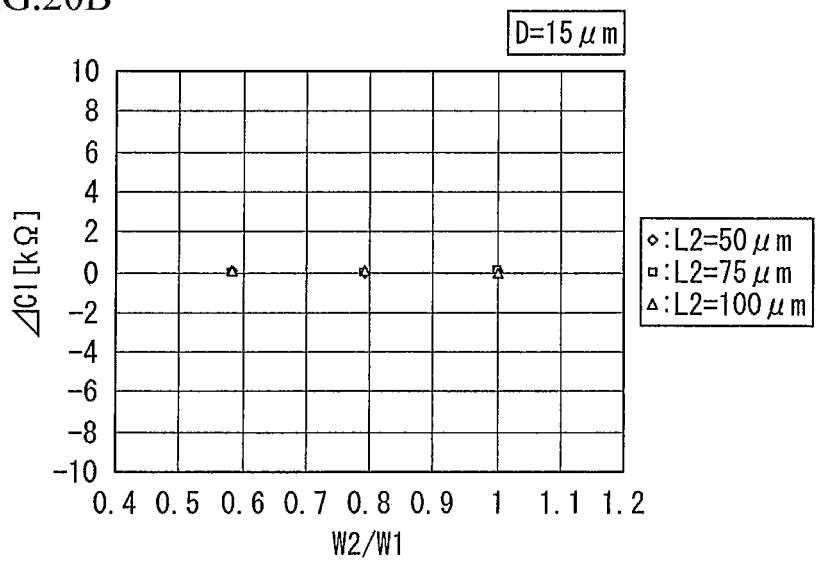
Figure 20C:
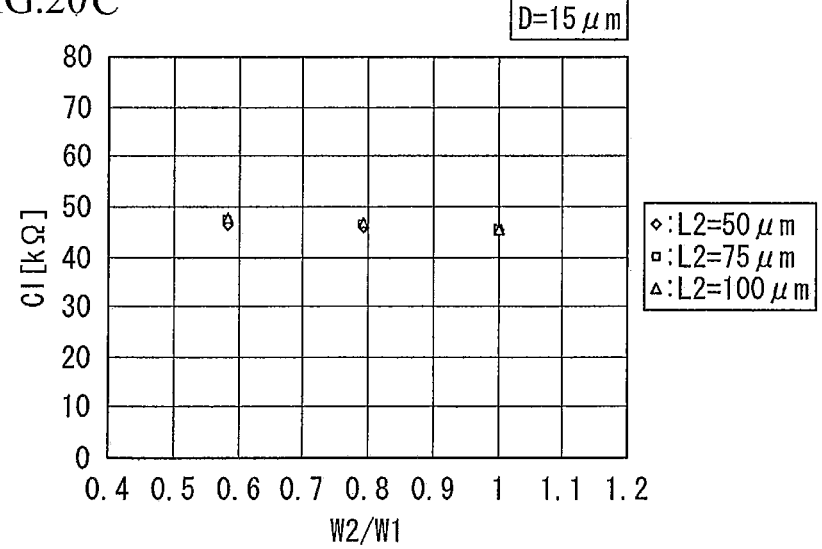

FIGS. 18A to 18C show the results. FIG. 18A is a graph showing the changes in the vibration leaks. FIG. 18B is a graph showing the changes in the CI value. FIG. 18C is a graph showing the absolute values of the CI value.

As apparent from these graphs, it can be seen that the above patterns (1) and (2) show little changes in the vibration leaks or CI value as compared with the pattern (3) and substantially the same absolute values of the CI value.

The pattern (3) corresponds to the case where the groove width W1 of the first groove portion 28 is the same as the groove width W2 of the second groove portion 29, and is regarded as effective in reducing the vibration leaks and the CI value when the reduced rigidity in the vibrating arm portions 20 and 21 is not taken into account.

Since the pattern (1) and the pattern (2) show the results comparable to the pattern (3), the operation of the present invention, that is, the reduced CI value while suppressing the reduced rigidity in the vibrating arm portions 20 and 21, can be confirmed.

Particularly, the patterns (1) and (2) satisfy the condition that the ratio of the groove width W2 of the second groove portion 29/the groove width W1 of the first groove portion 28 is equal to or higher than 0.4 and lower than 1.0 and the condition that the ratio of the groove length L2 of the second groove portion 29/the length L0 is equal to or higher than 0.04 and equal to or lower than 0.3. Thus, it can be seen that these conditions are essential.

Although the interval D between the first groove portion 28 and the second groove portion 29 was 5 μm in the above case, the same analysis was performed at the intervals D of 10 μm and 15 μm. FIGS. 19A to 19C and FIGS. 20A to 20C show the results. The same results can be obtained also in these cases.

<Second Analysis Test>

Next, the interval D between the first groove portion 28 and the second groove portion 29 was set to 5 μm, the length L0 consisting of the groove length L1 of the first groove portion 28, the groove length L2 of the second groove portion 29, and the interval D was set to 858 μm, the ratio of the groove width W2 of the second groove portion 29/the groove width W1 of the first groove portion 28 was set to 0.8, and the groove width W2 of the second groove portion 29 was set to 0.42 μm.

Changes in vibration leaks and CI value were analyzed in the following three patterns before and after the mount of the piezoelectric vibrating strip 5.

Figure 21A:
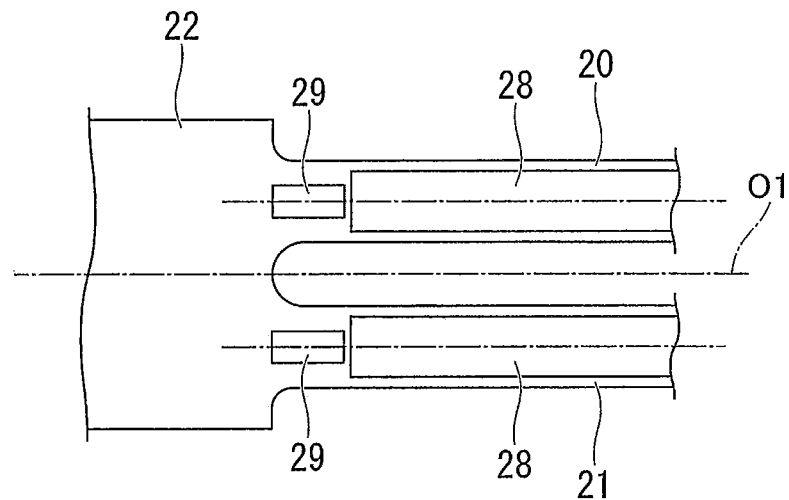

(1) As shown in FIG. 21A, the first groove portion 28 and the second groove portion 29 were placed in line symmetry with respect to the central axis O1 and were disposed at the centers of the vibrating arm portions 20 and 21 in the width direction M3, respectively.

Figure 21B:
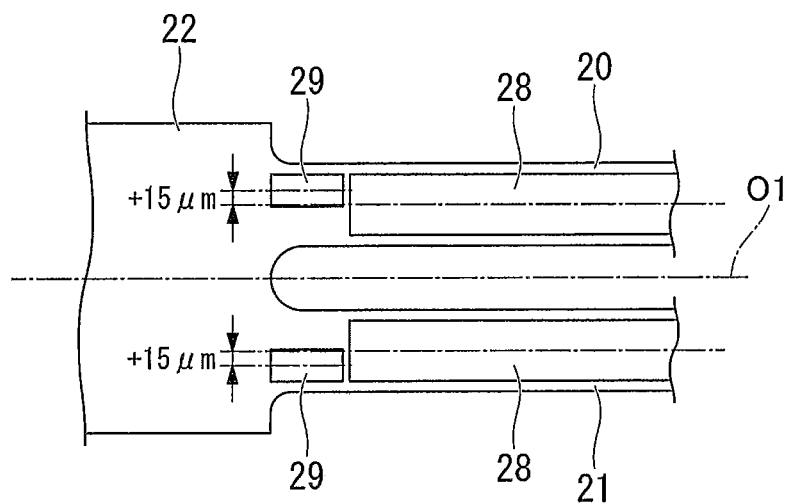

(2) As shown in FIG. 21B, the second groove portions 29 were offset outward by the same amount (+15 μm) from the centers of the vibrating arm portions 20 and 21 in the width direction M3, respectively.

Figure 21C:
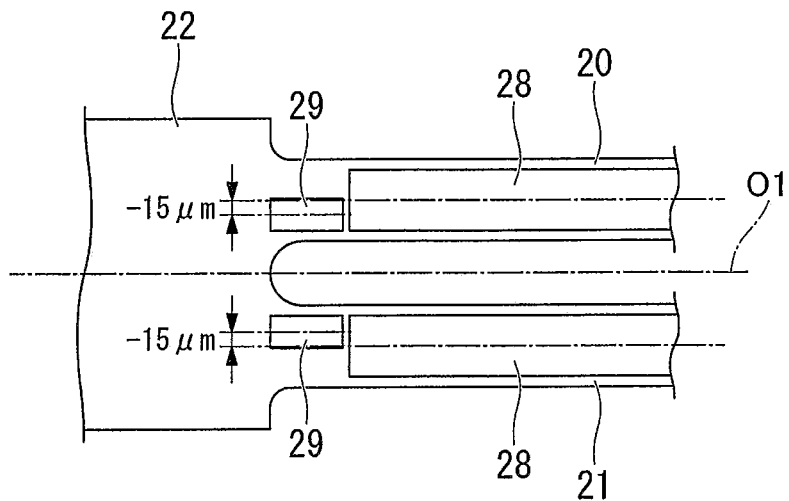

(3) As shown in FIG. 21C, the second groove portions 29 were offset inward by the same amount (−15 μm) from the centers of the vibrating arm portions 20 and 21 in the width direction M3, respectively.

Figure 22A:
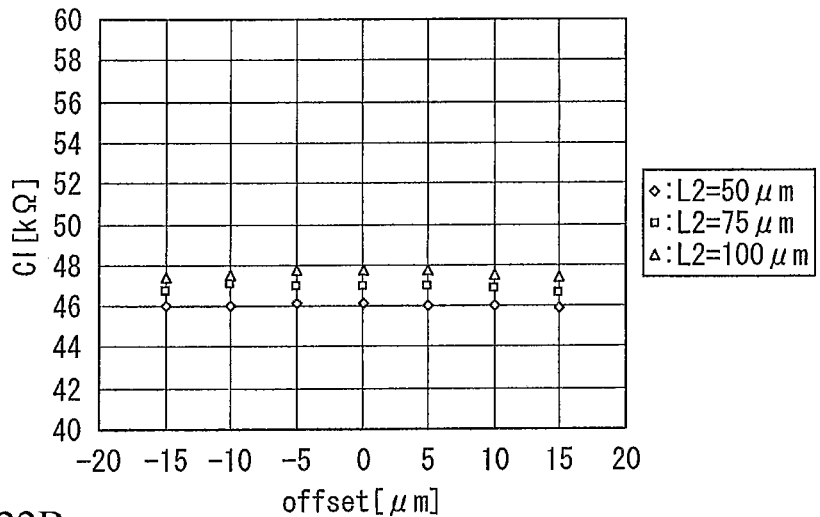
Figure 22B:
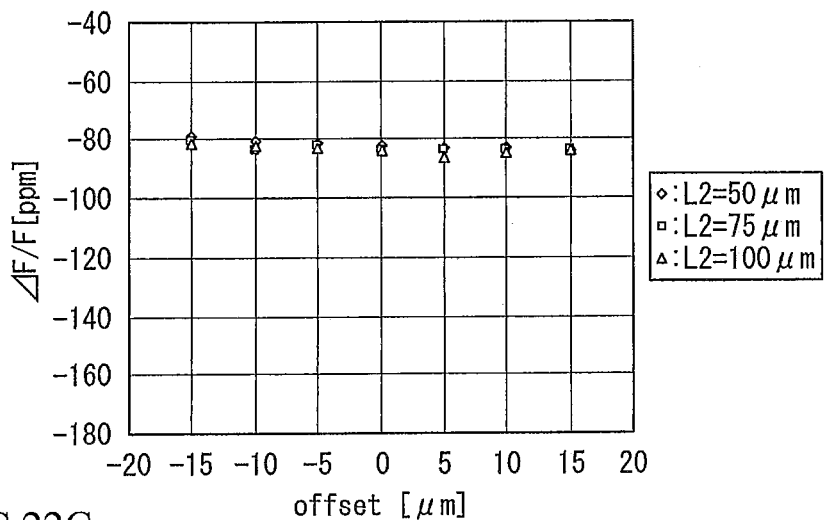
Figure 22C:
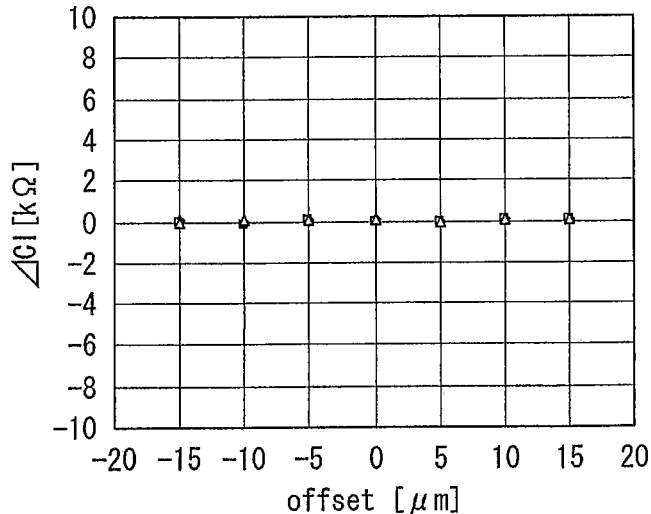

FIGS. 22A to 22C show the results. FIG. 22A is graph showing the absolute values of the CI value. FIG. 22B is a graph showing the changes in the vibration leaks. FIG. 22C is a graph showing the changes in the CI value.

As apparent from these graphs, it can be seen that the all the patterns (1) to (3) show little differences in the changes of the vibration leaks or CI value and substantially the same absolute values of the CI value.

From those results, it can be found that the same operations can be achieved regardless of the presence or absence of the offset as long as the second groove portions are formed in line symmetry with respect to the central axis O1.

The invention claimed is:

1. A piezoelectric vibrating strip comprising:
a pair of vibrating arm portions in parallel and extending parallel to a central axis therebetween; and
a base portion integrally cantilevering base end portions of the pair of vibrating arm portions in a length direction,
wherein each of the pair of vibrating arm portions include a single first groove portion and a second groove portion in a main face thereof, the first and second groove portions separated from one another,
the second groove portions of each of the vibrating arm portions are symmetrically located with respect to the central axis in the width direction of the piezoelectric vibrating strip,
the single first groove portion closer to a leading end portion in the length direction of the vibrating arm portion and having a groove width W1 along a width direction orthogonal to the length direction and a thickness direction of the vibrating arm portion and having a continuous bottom surface devoid of central projecting wall surfaces,
the second groove portion is closer to the base end portion than the single first groove portion and has a groove width W2 along the width direction, where a groove width ratio W2/W1 is between 0.4 and 1.0.

2. The piezoelectric vibrating strip of claim 1, wherein the groove width W2 of the second groove portion is smaller than the groove width W1 of the single first groove portion.

3. The piezoelectric vibrating strip of claim 1, wherein a ratio of a groove length L2 of the second groove portion to a length L0 is between 0.04 and 0.3, where L0 is the groove length along the length direction from the portion of the second groove portion located closer to the base end portion to the portion of the single first groove portion located closer to the leading end portion, and the groove length L2 is the groove length of the second groove portion along the length direction.

4. The piezoelectric vibrating strip of claim 1, wherein a groove length L2 of the second groove portion is shorter than a length L0, where L0 is the groove length along the length direction from the portion of the second groove portion located closer to the base end portion to the portion of the single first groove portion located closer to the leading end portion.

5. A piezoelectric vibrator including the piezoelectric vibrating strip according to claim 1, and a package including a base substrate and a lid substrate bonded together, wherein the piezoelectric vibrating strip is housed in a cavity between the base substrate and the lid substrate.

6. An oscillator including the piezoelectric vibrator according to claim 5 electrically connected as an oscillator to an integrated circuit.

7. An electronic device including the piezoelectric vibrator according to claim 5 electrically connected to a time measuring section.

8. A radio timepiece including the piezoelectric vibrator according to claim 5 electrically connected to a filter section.

9. The piezoelectric vibrating strip of claim 1, wherein a center in the width direction of the second groove portion is offset in the width direction with respect to a corresponding center of the single first groove portion.

10. The piezoelectric vibrating strip of claim 9, wherein the center of the second grove portion is offset in the width direction toward an outer edge of the vibrating arm portion with respect to the corresponding center of the single first groove portion.

11. The piezoelectric vibrating strip of claim 9, wherein the center of the second grove portion is offset in the width direction toward an inner edge of the vibrating arm portion with respect to the corresponding center of the single first groove portion.

12. A piezoelectric vibrating comprising:
a pair of vibrating arm portions in parallel and extending parallel to a central axis therebetween; and
a base portion integrally cantilevering base end portions of the pair of vibrating arm portions in a length direction,
wherein each of the pair of vibrating arm portions include a single first groove portion and a second groove portion in a main face thereof, the first and second groove portions separated from one another,
the single first groove portion closer to a leading end portion in the length direction of the vibrating arm portion and having a groove width W1 along a width direction orthogonal to the length direction and a thickness direction of the vibrating arm portion and having a continuous bottom surface devoid of central projecting wall surfaces,
the second groove portion is closer to the base end portion than the single first groove portion and has a groove width W2 along the width direction, where a groove width ratio W2/W1 is between 0.4 and 1.0, and
wherein the second groove portions are symmetrical in the width direction with respect to a virtual central axis extending in the length direction and dividing an etching residue left on a fork region at the base end portions of the pair of vibrating arm portions into two equal parts.

13. The piezoelectric vibrating strip of claim 12, wherein the etching residue is localized in the fork region closer to one of the vibrating arm portions than to a remaining one of the vibrating arm portions.

* * * * *